US009746770B2

(12) United States Patent
Pavlacky

(10) Patent No.: US 9,746,770 B2
(45) Date of Patent: Aug. 29, 2017

(54) THERMALLY DEVELOPABLE IMAGING MATERIALS AND METHODS

(71) Applicant: Carestream Health, Inc., Rochester, NY (US)

(72) Inventor: Erin C. Pavlacky, Lakeland Shores, MN (US)

(73) Assignee: Carestream Health, Inc., Rochester, NY (US)

( * ) Notice: Subject to any disclaimer, the term of this patent is extended or adjusted under 35 U.S.C. 154(b) by 0 days.

(21) Appl. No.: 15/151,567

(22) Filed: May 11, 2016

(65) Prior Publication Data
US 2016/0357104 A1 Dec. 8, 2016

Related U.S. Application Data

(60) Provisional application No. 62/169,707, filed on Jun. 2, 2015.

(51) Int. Cl.
*G03F 7/06* (2006.01)
*G03C 1/498* (2006.01)

(52) U.S. Cl.
CPC ........... *G03F 7/06* (2013.01); *G03C 1/49863* (2013.01); *G03C 1/49872* (2013.01)

(58) Field of Classification Search
CPC ... G03F 7/06; G03C 1/49872; G03C 1/49863; G03C 1/49818
USPC .................................................. 430/616, 618
See application file for complete search history.

(56) References Cited

U.S. PATENT DOCUMENTS

| | | | |
|---|---|---|---|
| 2,131,038 A | 9/1938 | Brooker et al. |
| 2,444,605 A | 7/1948 | Heimbach et al. |
| 2,489,341 A | 11/1949 | Waller et al. |
| 2,565,418 A | 8/1951 | Yackel et al. |
| 2,566,263 A | 8/1951 | Trivelli et al. |
| 2,597,915 A | 5/1952 | Yutzy et al. |
| 2,614,928 A | 10/1952 | Yutzy et al. |
| 2,618,556 A | 11/1952 | Hewitson et al. |
| 2,694,716 A | 11/1954 | Allen et al. |
| 2,839,405 A | 6/1958 | Jones et al. |
| 2,886,437 A | 5/1959 | Piper |
| 3,074,809 A | 1/1963 | Owen |
| 3,080,254 A | 3/1963 | Grant, Jr. |
| 3,220,839 A | 11/1965 | Herz et al. |
| 3,236,652 A | 2/1966 | Kennard et al. |
| 3,241,969 A | 3/1966 | Hart et al. |
| 3,287,135 A | 11/1966 | Anderson et al. |
| 3,330,663 A | 7/1967 | Weyde et al. |
| 3,438,776 A | 4/1969 | Yudelson |
| 3,440,049 A | 4/1969 | Moede |
| 3,446,648 A | 5/1969 | Workman |
| 3,457,075 A | 7/1969 | Morgan |
| 3,700,458 A | 10/1972 | Lindholm |
| 3,785,830 A | 1/1974 | Sullivan et al. |
| 3,832,186 A | 8/1974 | Masuda et al. |
| 3,839,049 A | 10/1974 | Simons |
| 3,844,797 A | 10/1974 | Willems et al. |
| 3,847,612 A | 11/1974 | Winslow |
| 3,951,660 A | 4/1976 | Hagemann et al. |
| 3,985,565 A | 10/1976 | Gabrielsen et al. |
| 4,076,539 A | 2/1978 | Ikenoue et al. |
| 4,082,901 A | 4/1978 | Laridon et al. |
| 4,123,274 A | 10/1978 | Knight et al. |
| 4,123,282 A | 10/1978 | Winslow |
| 4,220,709 A | 9/1980 | deMauriac |
| 4,260,677 A | 4/1981 | Winslow et al. |
| 4,504,575 A | 3/1985 | Lee |
| 4,761,361 A | 8/1988 | Ozaki et al. |
| 4,775,613 A | 10/1988 | Hirai et al. |
| 5,149,620 A | 9/1992 | Simpson et al. |
| 5,158,866 A | 10/1992 | Simpson et al. |
| 5,175,081 A | 12/1992 | Krepski et al. |
| 5,250,386 A | 10/1993 | Aono et al. |
| 5,298,390 A | 3/1994 | Sakizadeh et al. |
| 5,300,420 A | 4/1994 | Kenney et al. |
| 5,368,979 A | 11/1994 | Freedman et al. |
| 5,369,000 A | 11/1994 | Sakizadeh et al. |
| 5,374,514 A | 12/1994 | Kirk et al. |
| 5,382,504 A | 1/1995 | Shor et al. |
| 5,434,043 A | 7/1995 | Zou et al. |
| 5,460,938 A | 10/1995 | Kirk et al. |
| 5,464,737 A | 11/1995 | Sakizadeh et al. |
| 5,491,059 A | 2/1996 | Whitcomb |

(Continued)

FOREIGN PATENT DOCUMENTS

| | | |
|---|---|---|
| EP | 0 227 141 | 11/1986 |
| EP | 0 600 586 | 11/1993 |

(Continued)

OTHER PUBLICATIONS

*Research Disclosure*, Jun. 1978, item 17029, 7 pages.
*Research Disclosure*, Apr. 1983, item 22812, 4 pages.
*Research Disclosure*, Oct. 1983, item 23419, 4 pages.
F. Ruttens, "Polyvinyl butyral, More Than Just a Binder", Journal of Imaging Science and Technology, 43, (6) 535-539, 1999.

(Continued)

*Primary Examiner* — Geraldina Visconti

(74) *Attorney, Agent, or Firm* — Reed L. Christiansen

(57) ABSTRACT

A thermally developable material comprising a support and having thereon at least one non-photosensitive carrier layer comprising: a binder comprising vinyl butyral repeat units and alcohol repeat units, an adhesion promoting compound comprising ester repeat units, and a crosslinker comprising isocyanate repeat units; and at least one thermally developable imaging layer comprising organic silver salt grains, light-sensitive silver halide grains, a reducing agent, a binder comprising hydroxyl and butyral repeat units, and a crosslinker comprising at least one isocyanate group.

10 Claims, 1 Drawing Sheet

(56) References Cited

U.S. PATENT DOCUMENTS

| | | | |
|---|---|---|---|
| 5,541,054 A | 7/1996 | Miller et al. |
| 5,582,953 A | 12/1996 | Uyttendaele et al. |
| 5,594,143 A | 1/1997 | Kirk et al. |
| 5,599,647 A | 2/1997 | Defieuw et al. |
| 5,716,772 A | 2/1998 | Taguchi |
| 5,817,598 A | 10/1998 | Defieuw et al. |
| 5,928,857 A | 7/1999 | Geisler et al. |
| 5,939,249 A | 8/1999 | Zou |
| 6,013,420 A | 1/2000 | Wingender et al. |
| 6,096,486 A | 8/2000 | Emmers et al. |
| 6,143,487 A | 11/2000 | Philip et al. |
| 6,146,822 A | 11/2000 | Asanuma et al. |
| 6,159,667 A | 12/2000 | Emmers et al. |
| 6,165,704 A | 12/2000 | Miyake et al. |
| 6,171,767 B1 | 1/2001 | Kong et al. |
| 6,190,822 B1 | 2/2001 | Dickerson et al. |
| 6,313,065 B1 | 11/2001 | Horsten et al. |
| 6,350,561 B1 | 2/2002 | Miller et al. |
| 6,352,820 B1 | 3/2002 | Bauer et al. |
| 6,355,408 B1 | 3/2002 | Whitcomb et al. |
| 6,387,608 B2 | 5/2002 | Morita |
| 6,413,710 B1 | 7/2002 | Shor et al. |
| 6,420,102 B1 | 7/2002 | Bauer et al. |
| 6,465,162 B1 | 10/2002 | Kong et al. |
| 6,472,131 B1 | 10/2002 | Whitcomb |
| 6,475,715 B2 | 11/2002 | Hirai et al. |
| 6,599,685 B1 | 7/2003 | Kong |
| 6,677,274 B2 | 1/2004 | Geuens et al. |
| 6,689,548 B2 | 2/2004 | Yamashita et al. |
| 6,713,240 B2 | 3/2004 | Lynch et al. |
| 6,746,831 B1 | 6/2004 | Hunt |
| 6,803,177 B2 | 10/2004 | Bokhonov et al. |
| 6,841,343 B2 | 1/2005 | Lynch et al. |
| 6,942,960 B2 | 9/2005 | Maskasky et al. |
| 7,018,790 B2 | 3/2006 | Kashiwagi et al. |
| 7,135,432 B2 | 11/2006 | Whitcomb et al. |
| 7,144,694 B2 | 12/2006 | Kashiwagi et al. |
| 7,163,782 B2 | 1/2007 | Goto |
| 7,172,852 B2 | 2/2007 | Geuens et al. |
| 7,211,373 B2 | 5/2007 | Ohzeki et al. |
| 7,316,895 B2 | 1/2008 | Teranishi et al. |
| 7,326,527 B2 | 2/2008 | Goto et al. |
| 7,427,467 B2 | 9/2008 | Teranishi |
| 7,445,884 B2 | 11/2008 | Yanagisawa |
| 7,455,961 B2 | 11/2008 | Sakuragi et al. |
| 7,462,445 B2 | 12/2008 | Goto |
| 7,504,200 B2 | 3/2009 | Goto et al. |
| 7,695,898 B2 | 4/2010 | Ishihara |
| 9,335,623 B2 | 5/2016 | Pavlacky |
| 2003/0203323 A1 | 10/2003 | Takiguchi et al. |
| 2004/0053173 A1 | 3/2004 | Maskasky et al. |
| 2006/0293182 A1 | 12/2006 | Baird et al. |
| 2006/0293184 A1 | 12/2006 | Ishida et al. |
| 2008/0057447 A1 | 3/2008 | Goto |
| 2008/0057450 A1 | 3/2008 | Ulrich et al. |
| 2008/0085482 A1 | 4/2008 | Sakuragi et al. |
| 2008/0187875 A1 | 8/2008 | Goto et al. |
| 2009/0042125 A1 | 2/2009 | Goto et al. |
| 2009/0081578 A1 | 3/2009 | Burleva et al. |

FOREIGN PATENT DOCUMENTS

| | | |
|---|---|---|
| EP | 0 640 589 | 8/1994 |
| EP | 0 803 764 | 4/1997 |
| GB | 623448 | 7/1945 |
| GB | 1 439 478 | 12/1973 |
| GB | 1 565 043 | 3/1978 |
| JP | 49-13224 A | 2/1974 |
| JP | 50-17216 | 2/1975 |
| JP | 51-42529 | 4/1976 |
| WO | WO 96/15478 | 5/1996 |

OTHER PUBLICATIONS

Particle Size Analysis, ASTM Symposium on Light Microscopy, R. P. Loveland, 1955, pp. 94-122.

C. E. K. Mees and T. H. James, *The Theory of the Photographic Process*, Third Edition, Macmillan, New York, 1966, Chapter 2.

Z.M. Zhou et al., Synthesis Characterization and Miscibility of Polyvinyl Butyrals of Varying Vinyl Alcohol Contents, Turkish Journal of Chemistry, Scientific and Technological Research Council of Turkey, vol. 21, No. 4, Oct. 1, 1997, pp. 229-238, XP002741845, ISSN: 1300-0527.

International Search report for International application No. PCT/US2016/031957, dated Jul. 15, 2016, 2 pages.

| Appearance | Classification | Description |
|---|---|---|
| | 5 | The edges of the cuts are completely smooth. |
| | 4 | Small flakes of the coating are detached at intersections; < 5% of the test area is removed. |
| | 3 | Flakes of the coating are detached along edges and at intersections of cuts; 5 to 15% of the test area is removed. |
| | 2 | The coating has flaked along the edges and on parts of the squares; 15% to 35% of the test area is removed. |
| | 1 | The coating is removed along the edges of cuts in large ribbons and whole squares are detached; 35% to 65% of the test area is removed. |

THERMALLY DEVELOPABLE IMAGING MATERIALS AND METHODS

CROSS REFERENCE TO RELATED APPLICATIONS

This application claims the benefit of U.S. Provisional Patent Application No. 62/169,707, filed Jun. 2, 2015, entitled "THERMALLY DEVELOPABLE IMAGING MATERIALS AND METHODS," which is hereby incorporated by reference in its entirety.

BACKGROUND

U.S. Patent Application Publication No. 2008/0057450 to Ulrich et al. discloses thermally developable materials containing reducing agent combinations. PCT Publication WO 2007/001806 to Eastman Kodak discloses thermographic materials with highly polymerized binder polymer. U.S. Pat. No. 7,211,373 to Ohzeki et al. discloses photothermographic material. EP 0803764 to Fuji discloses a method for preparing a photothermographic material. U.S. Patent Application Publication No. 2003/0203323 to Takiguchi et al. discloses silver salt photothermographic dry imaging material. U.S. Pat. No. 7,172,852 to Geuens et al. discloses a thermographic recording material. Ruttens, Frank, "Polyvinyl butyral, More Than Just a Binder," *Journal of Imaging Science and Technology*, 43(6) 535-39 (1999), discusses various properties of poly(vinyl butyral) (PVB) resins. U.S. Pat. No. 6,387,608 to Morita discloses a photothermographic material. U.S. Pat. No. 6,475,715 to Hirai et al. discloses a photothermographic material and image forming method. U.S. Pat. No. 6,689,548 to Yamashita et al. discloses silver salt photothermographic dry imaging material, an image recording method, and an image forming method. U.S. Pat. No. 7,018,790 to Kashiwagi et al. discloses a photothermographic imaging material and method for forming image. U.S. Pat. No. 7,144,694 to Kashiwagi et al. discloses a photothermographic imaging material and method for forming an image. U.S. Pat. No. 7,163,782 to Goto discloses a photothermographic imaging material. U.S. Pat. No. 7,316,895 to Teranishi et al. discloses a method for precipitating separation of photosensitive silver halide particle dispersion and silver salt photothermographic dry imaging material using thereof. U.S. Pat. No. 7,326,527 to Goto et al. discloses silver salt photothermographic dry imaging material and image forming method by use thereof. U.S. Pat. No. 7,427,467 to Teranishi discloses silver salt photothermographic dry imaging material. U.S. Pat. No. 7,445,884 to Yanagisawa discloses a photothermographic material, development method, and thermal development device thereof. U.S. Pat. No. 7,455,961 to Sakuragi et al. discloses copolymer and photothermographic material containing the same. U.S. Pat. No. 7,462,445 to Goto discloses an image forming method. U.S. Pat. No. 7,504,200 to Goto et al. discloses a photothermographic material. U.S. Patent Publication No. 2008/0057447 to Goto discloses an image forming method. U.S. Patent Publication No. 2008/0085482 to Sakuragi et al. discloses copolymer sand photothermographic material containing the same. U.S. Patent Publication No. 2008/0187875 to Goto et al. discloses a photothermographic material. U.S. Patent Publication No. 2009/0042125 to Goto et al. discloses a photothermographic material. U.S. Pat. No. 7,695,898 discloses a thermally developable photosensitive material and image forming method. U.S. Pat. No. 9,335,623 to Pavlacky discloses a thermally developable material.

SUMMARY

A thermally developable material is disclosed comprising a support and having thereon at least one non-photosensitive carrier layer; and at least one thermally developable imaging layer comprising organic silver salt grains, light-sensitive silver halide grains, a reducing agent, a binder comprising hydroxyl and butryal repeat units, and a crosslinker comprising an isocyanate group.

In some embodiments, the at least one non-photosensitive carrier layer comprises a mixture of at least one binder comprising at least one butyral and at least one alcohol functional group; and at least one adhesion promoting compound. In some embodiments the said non-photosensitive carrier layer mixture further comprises at least one crosslinker and in some embodiments the at least one crosslinker comprises an isocyanate group, and in some embodiments the at least one isocyanate group comprises isocyanate repeat units. In some embodiments the at least one crosslinker comprises hexamethylene diisocyanate, and in some embodiments the at least one crosslinker comprises 1,6-hexamethylene diisocyanate while in some embodiments the at least one crosslinker comprises a trimer of hexamethylene diisocyanate.

In some embodiments the at least one binder in the at least one non-photosensitive carrier layer comprises a terpolymer of butyral, alcohol and acetate repeat units wherein in some embodiments the weight ratio of vinyl alcohol repeat units to vinyl butyral repeat units is about 1:5.

In some embodiments the weight ratio of the at least one adhesion promoting agent to the at least one binder in the at least one non-photosensitive carrier layer is about 1:2.3.

In some embodiments of the non-photosensitive carrier layer mixture the equivalent ratio of the vinyl alcohol repeat units in the at least one binder to the isocyanate groups in the at least one crosslinker has an upper bound about 56, while in other embodiments, the equivalent ratio of the vinyl alcohol repeat units in the at least one binder, to the isocyanate groups in the at least one crosslinker, is between about 14 and about 28. In some embodiments the equivalent ratio of the vinyl alcohol repeat units in the at least one binder, to the isocyanate groups in the at least one crosslinker, is about 14.

In some embodiments the at least one thermally developable imaging layer additionally comprises polyvinylpyrrolidone/vinyl acetate (PVP-VA), and in some embodiments, the weight ratio of polyvinylpyrrolidone/vinyl acetate (PVP-VA) to PVB (polyvinyl butyral) is about 1:21.

In some embodiments the least one adhesion promoting compound in the non-photosensitive carrier layer comprises ester groups, and in some embodiments the at least one adhesion promoting compound comprises polyester.

A thermally developable material is disclosed comprising a support and having thereon at least one non-photosensitive carrier layer; and at least one thermally developable imaging layer comprising organic silver salt grains, light-sensitive silver halide grains, a reducing agent, a binder comprising hydroxyl and butryal repeat units, and a crosslinker comprising an isocyanate group; and at least one topcoat layer.

In some embodiments the at least one non-photosensitive carrier layer comprises a mixture of at least one binder and at least one adhesion promoting compound. In some embodiments the said non-photosensitive carrier layer mixture further comprises at least one at least one crosslinker and in some embodiments the at least one crosslinker comprises an isocyanate group, and in other embodiments the at least isocyanate group comprises isocyanate repeat units. In some embodiments the at least one crosslinker comprises hexamethylene diisocyanate, and in some embodiments the at least one crosslinker comprises 1,6-hexamethylene diisocyanate while in some embodiments the at least one crosslinker comprises a trimer of hexamethylene diisocyanate.

In some embodiments the at least one binder in the at least one non-photosensitive carrier layer comprises a terpolymer of butyral, alcohol and acetate repeat units wherein in some embodiments the weight ratio of vinyl alcohol repeat units to vinyl butyral repeat units is about 1:5.

In some embodiments of the non-photosensitive carrier layer mixture the equivalent ratio of the vinyl alcohol repeat units in the at least one binder to the isocyanate groups in the at least one crosslinker has an upper bound about 56, while in other embodiments the equivalent ratio of the vinyl alcohol repeat units in the at least one binder, to the isocyanate groups in the at least one crosslinker, is between about 14 and about 28. In some other embodiments the equivalent weight ratio of the vinyl alcohol repeat units in the at least one binder, to the isocyanate groups in the at least one crosslinker, is about 14.

In some embodiments the at least one thermally developable imaging layer additionally comprises polyvinylpyrrolidone/vinyl acetate (PVP-VA), and in some embodiments the weight ratio of polyvinylpyrrolidone/vinyl acetate (PVP-VA) to PVB (polyvinyl butyral) is about 1:21.

In some embodiments the least one adhesion promoting compound in the at least one non-photosensitive carrier layer comprises ester groups, and in some embodiments the at least one adhesion promoting compound comprises polyester.

In some embodiments the weight ratio of the at least one adhesion promoting compound to the at least binder in the at least one non-photosensitive carrier layer is about 1:2.3.

Methods for preparation of the photothermographic material are disclosed comprising: sequential coating of a transparent substrate with at least one non-photosensitive carrier layer, and simultaneous coating of said non-photosensitive carrier layer with at least one thermally developable imaging layer. In some embodiments, the time allotted between the coating of the at least one non-photosensitive carrier layer and the simultaneous coating of the at least one thermally developable imaging layer is between about 0 and 24 hours. In some embodiments, the time allotted between the coating of the at least one non-photosensitive carrier layer and the simultaneous coating of the at least one thermally developable imaging is about 24 hours. In some embodiments, the non-photosensitive carrier layer is mixed and applied to the substrate between 0 and 36 days after it is mixed and prepared.

Methods for preparation of the photothermographic material are disclosed comprising: sequential coating of a transparent substrate with at least one non-photosensitive carrier layer, and simultaneous coating of said non-photosensitive carrier layer with at least one thermally developable imaging layer and at least one topcoat layer. In some embodiments, the time allotted between the coating of the at least one non-photosensitive carrier layer and the simultaneous coating of the at least one thermally developable imaging layer and at least one topcoat layer is between about 0 and 24 hours. In some embodiments, the time allotted between the coating of the at least one non-photosensitive carrier layer and the simultaneous coating of the at least one thermally developable imaging layer and topcoat layer is about 24 hours. In some embodiments, the non-photosensitive carrier layer is mixed and applied to the substrate between 0 and 36 days after it is mixed and prepared.

Other embodiments provide a thermally developable material comprising a support and having thereon: at least one non-photosensitive carrier layer comprising at least one first binder comprising first vinyl butyral repeat units and first vinyl alcohol repeat units, at least one adhesion promoting compound, and at least one first crosslinker comprising first isocyanate groups; and at least one thermally developable imaging layer comprising organic silver salt grains, light-sensitive silver halide grains, at least one reducing agent, at least one second binder comprising second vinyl butyral repeat units and second vinyl alcohol repeat units, and at least one second crosslinker comprising second isocyanate groups, where the equivalent ratio of the first vinyl alcohol repeat units to the second isocyanate groups is no greater than about 56.

In at least some such embodiments, the at least one first crosslinker is selected from the group consisting of 1,6-hexamethylene diisocyanate, trimer hexamethylene diisocyanate, and poly(1,6-hexamethylene diisocyanate). In some cases, the at least one second crosslinker is also selected from the group consisting of 1,6-hexamethylene diisocyanate, trimer hexamethylene diisocyanate, and poly (1,6-hexamethylene diisocyanate).

In at least some such embodiments, the equivalent ratio of the first vinyl alcohol repeat units to the second isocyanate groups is between about 14 and about 28 or, in some cases, the ratio is about 14.

In at least some such embodiments, the at least one thermally developable layer further comprises poly(vinyl pyrrolidone/vinyl acetate).

In at least some such embodiments, the at least one adhesion promoting compound comprises ester groups.

In at least some such embodiments, the at least one first binder comprises poly[(vinyl butyral)-ran-(vinyl alcohol)-ran-(vinyl acetate)]. In some such cases, the weight ratio of the first vinyl alcohol repeat units to the first vinyl butyral repeat units is about 1:5.

Still other embodiments provide methods for preparation of such thermally developable materials, the methods comprising: disposing the at least one non-photosensitive carrier layer on the substrate; and disposing the at least one thermally developable imaging layer on the at least one non-photo-sensitive carrier layer.

Other aspects, advantages, and benefits of the present invention are apparent from the description, exemplary embodiments, and examples provided in this application.

BRIEF DESCRIPTION OF FIGURES

FIG. 1 depicts Appearance, Classification, and Description for use in classifying $D_{max}$ carrier adhesion.

DESCRIPTION

All publications, patents, and patent documents referred to in this document are incorporated by reference herein in their entirety, as though individually incorporated by reference.

U.S. Provisional Patent Application No. 62/169,707, filed Jun. 2, 2015, entitled "THERMALLY DEVELOPABLE IMAGING MATERIALS AND METHODS," is hereby incorporated by reference in its entirety.

Definitions

As Used Herein:

In the descriptions of the materials, "a" or component refers to "at least one" or "one or more" of that component.

"Thermally developable materials" refers to either "photothermographic materials" or "thermographic materials."

"Photothermographic material(s)" means a dry processable integral element comprising a support and at least one photothermographic emulsion layer or a set of photothermographic emulsion layers. The photosensitive silver halide and the source of reducible silver ions may be in one layer and the other necessary components or additives may be distributed, as desired, in the same layer or in one or more adjacent coated layers. These materials may include multilayer constructions in which one or more imaging components are in different layers, but are in "reactive association." For example, one layer can include the source of reducible silver ions and another layer can include the reducing composition, but the two reactive components are in reactive association with each other.

"Thermographic materials" are similarly defined except that no photosensitive silver halide catalyst is purposely added or created.

When used in photothermography, the "imagewise exposing" or "image-wise exposure" means that the material is imaged as a dry processable material using any exposure means that provides a latent image using electro-magnetic radiation. This includes, for example, by analog exposure where an image is formed by projection onto the photosensitive material as well as by digital exposure where the image is formed one pixel at a time such as by modulation of scanning laser radiation.

When used in thermography, the term, "imagewise exposing" or "imagewise exposure" means that the material is imaged as a dry processable material using any means that provides an image using heat. This includes, for example, by analog exposure where an image is formed by differential contact heating through a mask using a thermal blanket or infrared heat source, as well as by digital exposure where the image is formed one pixel at a time such as by modulation of thermal print-heads or by thermal heating using scanning laser radiation.

The term "emulsion layer," "imaging layer," "thermographic emulsion layer," or "photothermographic emulsion layer" means a layer of a thermographic or photothermographic material that contains the photosensitive silver halide (when used) and/or source of reducible silver ions, or a reducing composition. Such layers can also contain additional components or desirable additives. These layers are on what is referred to as the "frontside" of the support.

"Photocatalyst" means a photosensitive compound such as silver halide that, upon exposure to radiation, provides a compound that is capable of acting as a catalyst for the subsequent development of the image-forming material.

"Catalytic proximity" or "reactive association" means that the reactive components are in the same layer or in adjacent layers so that they readily come into contact with each other during imaging and thermal development.

"Simultaneous coating" or "wet-on-wet" coating means that when multiple layers are coated, subsequent layers are coated onto the initially coated layer before the initially coated layer is dry. Simultaneous coating can be used to apply layers on the frontside, backside, or both sides of the support.

"Transparent" means capable of transmitting visible light or imaging radiation without appreciable scattering or absorption.

The phrases "silver salt" and "organic silver salt" refer to an organic molecule having a bond to a silver atom. Although the compounds so formed are technically silver coordination complexes or silver compounds they are also often referred to as silver salts.

"Silver Efficiency" is defined as Dmax divided by the total silver coating weight in units of $g/m^2$.

The terms "coating weight," "coat weight," and "coverage" are synonymous, and are usually expressed in weight or moles per unit area such as $g/m^2$ or $mol/m^2$.

"Ultraviolet region of the spectrum" refers to that region of the spectrum less than or equal to 400 nm (preferably from about 100 nm to about 400 nm) although parts of these ranges may be visible to the naked human eye.

"Visible region of the spectrum" refers to that region of the spectrum of from about 400 nm to about 700 nm.

"Non-photosensitive" means not intentionally light sensitive.

The sensitometric terms "photospeed," "speed," or "photographic speed" (also known as sensitivity), "absorbance," and "contrast" have conventional definitions known in the imaging arts. The sensitometric term "absorbance" is a synonym for optical density (OD).

In photothermographic materials, the term Dmin (lower case), which is also referred to as minimum density, is considered herein as image density achieved when the photothermographic material is thermally developed without prior exposure to radiation. The term Dmax (lower case is the maximum image density achieved in the imaged area of a particular sample after imaging and development.

"K-value" is a solvent-dependent index for the viscosity of a polymer solution, which is determined by multiplying by 1000 the positive root "k" of the Fikentscher equation:

$$\frac{1}{c}\log_{10}\frac{\eta_c}{\eta_0} = \frac{75k^2}{1+1.5kc} + k,$$

where $\eta_c$ is the viscosity of the solution, $\eta_o$ is the viscosity of the solvent, and c is the polymer concentration in grams/100 mL.

Tg is the glass transition temperature and can be determined by Differential Scanning Calorimetry.

Copolymers (including any number of different types of repeat units, such as, for example, terpolymers) are included in the definition of polymers.

As is well understood in this art, for the chemical compounds herein described, substitution is not only tolerated, but is often advisable, and various substituents are anticipated on the compounds used in the present invention unless otherwise stated. Thus, when a compound is referred to as "having the structure" of a given formula or being a "derivative" of a compound, any substitution that does not alter the bond structure of the formula or the shown atoms within that structure is included within the formula, unless such substitution is specifically excluded by language.

The Photocatalyst

As noted above, photothermographic materials include one or more photocatalysts in the photothermographic emulsion layer(s). Useful photocatalysts are typically photosensitive silver halides such as silver bromide, silver iodide, silver chloride, silver bromoiodide, silver chlorobromoiodide, silver chlorobromide, and others readily apparent to one skilled in the art. Mixtures of silver halides can also be used in any suitable proportion. Silver bromide and silver iodide are preferred. More preferred is silver bromoiodide in which any suitable amount of iodide is present up to almost 100% silver iodide and more likely up to about 40 mol % silver iodide. Even more preferably, the silver bromoiodide comprises at least 70 mole % (preferably at least 85 mole % and more preferably at least 90 mole %) bromide (based on total silver halide). The remainder of the halide is iodide, chloride, or chloride and iodide. Preferably the additional halide is iodide. Silver bromide and silver bromoiodide are most preferred, with the latter silver halide generally having up to 10 mole % silver iodide.

In some embodiments of aqueous-based photothermographic materials, higher amounts of iodide may be present in homogeneous photo-sensitive silver halide grains, and particularly from about 20 mol % up to the saturation limit of iodide as described, for example, U.S. Patent Application Publication 2004/0053173 (Maskasky et al.).

The silver halide grains may have any crystalline habit or morphology including, but not limited to, cubic, octahedral, tetrahedral, orthorhombic, rhombic, dodecahedral, other polyhedral, tabular, laminar, twinned, or platelet morphologies and may have epitaxial growth of crystals thereon. If desired, a mixture of grains with different morphologies can be employed. Silver halide grains having cubic and tabular morphology (or both) are preferred.

The silver halide grains may have a uniform ratio of halide throughout. They may also have a graded halide content, with a continuously varying ratio of, for example, silver bromide and silver iodide or they may be of the core-shell type, having a discrete core of one or more silver halides, and a discrete shell of one or more different silver halides. Core-shell silver halide grains useful in photothermographic materials and methods of preparing these materials are described in U.S. Pat. No. 5,382,504 (Shor et al.). Iridium and/or copper doped core-shell and non-core-shell grains are described in U.S. Pat. No. 5,434,043 (Zou et al.) and U.S. Pat. No. 5,939,249 (Zou). Bismuth(III)-doped high silver iodide emulsions for aqueous-based photothermographic materials are described in U.S. Pat. No. 6,942,960 (Maskasky et al.).

In some instances, it may be helpful to prepare the photosensitive silver halide grains in the presence of a hydroxytetraazaindene (such as 4-hydroxy-6-methyl-1,3,3a, 7-tetraazaindene) or an N-heterocyclic compound comprising at least one mercapto group (such as 1-phenyl-5-mercaptotetrazole) as described in U.S. Pat. No. 6,413,710 (Shor et al.).

The photosensitive silver halide can be added to (or formed within) the emulsion layer(s) in any fashion as long as it is placed in catalytic proximity to the source of reducible silver ions.

It is preferred that the silver halides be preformed and prepared by an ex-situ process. With this technique, one has the possibility of more precisely controlling the grain size, grain size distribution, dopant levels, and composition of the silver halide, so that one can impart more specific properties to both the silver halide grains and the resulting photothermographic material.

In some constructions, it is preferable to form the non-photo-sensitive source of reducible silver ions in the presence of ex-situ-prepared silver halide. In this process, the source of reducible silver ions, such as a long chain fatty acid silver carboxylate (commonly referred to as a silver "soap", or homogenate), is formed in the presence of preformed silver halide grains. Co-precipitation of the source of reducible silver ions in the presence of silver halide provides a more intimate mixture of the two materials to provide a material often referred to as a "preformed soap." (See, e.g., U.S. Pat. No. 3,839,049 (Simons)).

In some constructions, it is preferred that preformed silver halide grains be added to and "physically mixed" with the source of reducible silver ions.

Preformed silver halide emulsions can be prepared by aqueous or organic processes and can be unwashed or washed to remove soluble salts. Soluble salts can be removed by any desired procedure for example as described in U.S. Pat. No. 2,489,341 (Waller et al.), U.S. Pat. No. 2,565,418 (Yackel), U.S. Pat. No. 2,614,928 (Yutzy et al.), U.S. Pat. No. 2,618,556 (Hewitson et al.), and U.S. Pat. No. 3,241,969 (Hart et al.).

It is also effective to use an in-situ process in which a halide- or a halogen-containing compound is added to an organic silver salt to partially convert the silver of the organic silver salt to silver halide. Inorganic halides (such as zinc bromide, zinc iodide, calcium bromide, lithium bromide, lithium iodide, or mixtures thereof) or an organic halogen-containing compound (such as N-promo-succinimide or pyridinium hydrobromide perbromide) can be used. The details of such in-situ generation of silver halide are well known and described in U.S. Pat. No. 3,457,075 (Morgan et al.).

It is particularly effective to use a mixture of both preformed and in-situ generated silver halide. The preformed silver halide is preferably present in a preformed soap.

Additional methods of preparing silver halides and organic silver salts and blending them are described in *Research Disclosure*, June 1978, item 17029, U.S. Pat. No. 3,700,458 (Lindholm), U.S. Pat. No. 4,076,539 (Ikenoue et al.), Japan Kokai 49-013224 (Fuji), 50-017216 (Fuji), and 51-042529 (Fuji).

The silver halide grains used in the imaging formulations can vary in average diameter of up to several micrometers depending on the desired use. Preferred silver halide grains for use in preformed emulsions containing silver carboxylates are cubic grains having a number average particle size of from about 0.01 to about 1.0 µm, more preferred are those having a number average particle size of from about 0.03 to about 0.1 µm. It is even more preferred that the grains have a number average particle size of 0.06 µm or less, and most preferred that they have a number average particle size of from about 0.03 to about 0.06 µm. Mixtures of grains of various average particle sizes can also be used. Preferred silver halide grains for high-speed photothermographic constructions are tabular grains having an average thickness of at least 0.02 µm and up to and including 0.10 µm, an equivalent circular diameter of at least 0.5 µm and up to and including 8 µm, and an aspect ratio of at least 5:1. More preferred are those having an average thickness of at least 0.03 µm and up to and including 0.08 µm, an equivalent circular diameter of at least 0.75 µm and up to and including 6 µm, and an aspect ratio of at least 10:1.

The average size of the photosensitive silver halide grains is expressed by the average diameter if the grains are spherical, and by the average of the diameters of equivalent circles for the projected images if the grains are cubic or in other non-spherical shapes. Representative grain sizing methods are described in *Particle Size Analysis*, ASTM Symposium on Light Microscopy, R. P. Loveland, 1955, pp. 94-122, and in C. E. K. Mees and T. H, James, *The Theory of the Photographic Process*, Third Edition, Macmillan, New York, 1966, Chapter 2. Particle size measurements may be expressed in terms of the projected areas of grains or approximations of their diameters. These will provide reasonably accurate results if the grains of interest are substantially uniform in shape.

The one or more light-sensitive silver halides are preferably present in an amount of from about 0.005 to about 0.5 mole, more preferably from about 0.01 to about 0.25 mole, and most preferably from about 0.03 to about 0.15 mole, per mole of source of reducible silver ions.

Source of Reducible Silver Ions

The source of reducible silver ions may be any silver-organic compound that contains reducible silver(I) ions. Such compounds may be silver salts of silver coordinating ligands. Such a silver salt may be an organic silver salt that is comparatively stable to light and forms a silver image when heated to 50° C. or higher in the presence of a reducing agent. Mixtures of the same or different types of silver salts can be used if desired.

Suitable organic silver salts may include silver salts of organic compounds having a carboxylic acid group. Examples thereof include silver salts of aliphatic and aromatic carboxylic acids. Silver salts of long-chain aliphatic carboxylic acids are preferred. The chains typically contain 10 to 30, and preferably 15 to 28, carbon atoms. Preferred examples of the silver salts of aliphatic carboxylic acids include silver behenate, silver arachidate, silver stearate, silver oleate, silver laurate, silver caprate, silver myristate, silver palmitate, silver maleate, silver fumarate, silver tartarate, silver furoate, silver linoleate, silver butyral, silver camphorate, and mixtures thereof. Preferably, silver behenate is used alone or in mixtures with other silver salts.

In some embodiments, a highly crystalline silver behenate can be used as part or all of the sources of reducible silver ions as described in U.S. Pat. No. 6,096,486 (Emmers et al.) and U.S. Pat. No. 6,159,667 (Emmers et al.), both incorporated herein by reference in their entirety. Moreover, the silver behenate can be used in its one or more crystallographic phases (such as a mixture of phases I, II and/or III) as described in U.S. Pat. No. 6,677,274 (Geuens et al.) that is incorporated herein by reference in its entirety.

Other examples of silver salts include but are not limited to, silver salts of aromatic carboxylic acids and other carboxylic acid group-containing compounds, silver salts of aliphatic carboxylic acids containing a thioether group as described in U.S. Pat. No. 3,330,663 (Weyde et al.), silver carboxylates comprising hydrocarbon chains incorporating ether or thioether linkages, or sterically hindered substitution in the α-(on a hydrocarbon group) or ortho-(on an aromatic group) position, as described in U.S. Pat. No. 5,491,059 (Whitcomb), silver salts of aliphatic, aromatic, or heterocyclic dicarboxylic acids, silver salts of sulfonates as described in U.S. Pat. No. 4,504,575 (Lee), silver salts of sulfosuccinates as described in EP 0 227 141 A1 (Agfa), silver salts of acetylenes as described in U.S. Pat. No. 4,761,361 (Ozaki et al.) and U.S. Pat. No. 4,775,613 (Hirai et al.), silver salts of compounds containing mercapto or thione groups and derivatives thereof (such as those having a heterocyclic nucleus containing five or six atoms in the ring, at least one of which is a nitrogen atom), as described in U.S. Pat. No. 4,123,274 (Knight et al.) and U.S. Pat. No. 3,785,830 (Sullivan et al.), silver salts of mercapto or thione substituted compounds that do not contain a heterocyclic nucleus, silver salts of compounds containing an imino group (such as silver salts of benzotriazole and substituted derivatives thereof), silver salts of 1,2,4-triazoles or 1-H-tetrazoles as described in U.S. Pat. No. 4,220,709 (deMauriac), and silver salts of imidazole and substituted imidazoles as described in U.S. Pat. No. 4,260,677 (Winslow et al.).

It is also convenient to use silver half soaps that are blends of silver carboxylates and carboxylic acids each having from 10 to 30 carbon atoms.

The methods used for making silver soap emulsions are well known in the art and are disclosed in *Research Disclosure*, April 1983, item 22812, *Research Disclosure*, October 1983, item 23419, U.S. Pat. No. 3,985,565 (Gabrielsen et al.), and the references cited above.

Sources of reducible silver ions can also be provided as core-shell silver salts such as those described in U.S. Pat. No. 6,355,408 (Whitcomb et al.) or as silver dimer compounds that comprise two different silver salts as described in U.S. Pat. No. 6,472,131 (Whitcomb), both of which are incorporated herein by reference in their entirety.

Still other useful sources of reducible silver ions are the silver core-shell compounds comprising a primary core comprising one or more photo-sensitive silver halides, or one or more inorganic metal salts or non-silver containing organic salts, and a shell at least partially covering the primary core, wherein the shell comprises one or more silver salts, each of which silver salts comprises a organic silver coordinating ligand. Such compounds are described in U.S. Pat. No. 6,803,177 (Bokhonov et al.) that is incorporated herein by reference in its entirety.

The one or more sources of reducible silver ions are preferably present in an amount of from about 5% to about 70% (more preferably, from about 10% to about 50%), based on the total dry weight of the emulsion layers. Stated another way, the amount of the sources of reducible silver ions is generally present in an amount of from about 0.001 to about 0.2 mol/m$^2$ of the thermographic material, and preferably from about 0.006 to about 0.012 mol/m$^2$ of that material.

Reducing Agents

The thermographic materials include one or more reducing agents (of the same or different types) to reduce the silver ions during imaging. Such reducing agents are well known to those skilled in the art and include, for example, aromatic di- and tri-hydroxy compounds having at least two hydroxy groups in ortho- or para-relationship on the same aromatic nucleus such as hydroquinone and substituted hydroquinones, catechols, pyrogallol, gallic acid and gallic acid esters (for example, methyl gallate, ethyl gallate, propyl gallate), and tannic acid.

Particularly preferred are catechol-type reducing agents having no more than two hydroxy groups in an ortho-relationship.

One particularly preferred class of catechol-type reducing agents are benzene compounds in which the benzene nucleus is substituted by no more than two hydroxy groups which are present in 2,3-position on the nucleus and have in the 1-position of the nucleus a substituent linked to the nucleus by means of a carbonyl group. Compounds of this type include 2,3-dihydroxy-benzoic acid and 2,3-dihydroxy-benzoic acid esters (such as methyl 2,3-dihydroxy-benzoate, and ethyl 2,3-dihydroxy-benzoate).

Another particularly preferred class of catechol-type reducing agents are benzene compounds in which the benzene nucleus is substituted by no more than two hydroxy groups which are present in 3,4-position on the nucleus and have in the 1-position of the nucleus a substituent linked to the nucleus by means of a carbonyl group. Compounds of this type include, for example, 3,4-dihydroxy-benzoic acid, 3-(3,4-dihydroxy-phenyl)-propionic acid, 3,4-dihydroxy-benzoic acid esters (such as methyl 3,4-dihydroxy-benzoate, and ethyl 3,4-dihydroxy-benzoate), 3,4-dihydroxy-benzaldehyde, and phenyl-(3,4-dihydroxyphenyl)ketone, 3,4-Dihydroxybenzonitrile is also useful. Such compounds are described, for example, in U.S. Pat. No. 5,582,953 (Uyttendaele et al.) that is incorporated herein by reference in its entirety.

Mixtures of catechol reducing agents with various substituents can be used to optimize reactivity, Dmax, Dmin, and other imaging properties of the thermographic material.

Still another particularly useful class of reducing agents are the polyhydroxy spiro-bis-indane compounds that are described in U.S. Pat. No. 3,440,049 (Moede) and U.S. Pat. No. 5,817,598 (Defieuw et al.), both of which are incorporated herein by reference in their entirety.

In some constructions, "hindered phenol reducing agents" can be used. "Hindered phenol reducing agents" are compounds that contain only one hydroxy group on a given phenyl ring and have at least one additional substituent located ortho to the hydroxy group.

One type of hindered phenol includes hindered phenols and hindered naphthols.

Another type of hindered phenol reducing agents are hindered bis-phenols. These compounds contain more than one hydroxy group each of which is located on a different phenyl ring. This type of hindered phenol includes, for example, binaphthols (that is dihydroxybinaphthyls), biphenols (that is dihydroxybiphenyls), bis(hydroxynaphthyl)methanes, bis(hydroxyphenyl)-methanes bis(hydroxyphenyl)ethers, bis(hydroxyphenyl)sulfones, and bis(hydroxyphenyl)thioethers, each of which may have additional substituents.

Preferred hindered phenol reducing agents are bis(hydroxyphenyl)-methanes such as, bis(2-hydroxy-3-t-butyl-5-methylphenyl)methane (CAO-5), 1,1'-bis(2-hydroxy-3,5-dimethylphenyl)-3,5,5-trimethylhexane (NONOX® or PERMANAX® WSO), and 1,1'-bis(2-hydroxy-3,5-dimethylphenyl)isobutane (LOWINOX® 221B46). Mixtures of hindered phenol reducing agents can be used if desired.

Further reducing agents include certain ortho-amino-phenol, para-amino-phenol, and hydroquinone (that is, para-hydroxy-phenol) compounds described in U.S. Pat. No. 7,135,432 (Whitcomb et al.) that is incorporated herein by reference in its entirety.

The reducing agent (or mixture thereof) described herein is generally present in an amount greater than 0.1 mole per mole of silver and at 1 to 10% (dry weight) of the emulsion layer. In multilayer constructions, if the reducing agent is added to a layer other than an emulsion layer, slightly higher proportions, of from about 2 to 15 weight % may be more desirable. Any co-developers may be present generally in an amount of from about 0.001% to about 1.5% (dry weight) of the emulsion layer coating.

Stated another way, the reducing agents described herein can be present in an amount of at least 0.03 mol/mol of total silver. Preferably, they are present in an amount of from about 0.05 to about 2 mol/mol of total silver. The total amount of silver in the thermographic materials is at least 3 mmol/m$^2$ and preferably from about 6 to about 12 mmol/m$^2$.

Other Addenda

The direct thermographic materials can also contain other additives such as toners, shelf-life stabilizers, contrast enhancers, dyes or pigments, post-processing stabilizers or stabilizer precursors, thermal solvents (also known as melt formers), and other image-modifying agents as would be readily apparent to one skilled in the art.

Suitable stabilizers that can be used alone or in combination include thiazolium salts as described in U.S. Pat. No. 2,131,038 (Brooker) and U.S. Pat. No. 2,694,716 (Allen), azaindenes as described in U.S. Pat. No. 2,886,437 (Piper), triazaindolizines as described in U.S. Pat. No. 2,444,605 (Heimbach), the urazoles described in U.S. Pat. No. 3,287,135 (Anderson), sulfocatechols as described in U.S. Pat. No. 3,236,652 (Kennard), the oximes described in GB 623,448 (Eastman Kodak), polyvalent metal salts as described in U.S. Pat. No. 2,839,405 (Jones), thiuronium salts as described in U.S. Pat. No. 3,220,839 (Herz), palladium, platinum, and gold salts as described in U.S. Pat. No. 2,566,263 (Trivelli) and U.S. Pat. No. 2,597,915 (Yutzy), compounds having —SO$_2$CBr$_3$ groups as described in U.S. Pat. No. 5,369,000 (Sakizadeh et al.), U.S. Pat. No. 5,464,737 (Sakizadeh et al.), U.S. Pat. No. 5,594,143 (Kirk et al.), U.S. Pat. No. 5,374,514 (Kirk et al.), and U.S. Pat. No. 5,460,938 (Kirk et al.).

Stabilizer precursor compounds capable of releasing stabilizers upon application of heat during imaging can also be used, as described in U.S. Pat. No. 5,158,866 (Simpson et al.), U.S. Pat. No. 5,175,081 (Krepski et al.), U.S. Pat. No. 5,298,390 (Sakizadeh et al.), and U.S. Pat. No. 5,300,420 (Kenney et al.).

In addition, certain substituted-sulfonyl derivatives of benzo-triazoles may be used as stabilizing compounds as described in U.S. Pat. No. 6,171,767 (Kong et al.).

"Toners" or derivatives thereof that improve the image are desirable components of the thermographic materials. These compounds, when added to the imaging layer, shift the color of the image from yellowish-orange to brown-black or blue-black. Generally, one or more toners described herein are present in an amount of from about 0.01% to about 10% (more preferably from about 0.1% to about 10%), based on the total dry weight of the layer in which the toner is included. Toners may be incorporated in the thermographic emulsion layer or in an adjacent non-imaging layer.

Compounds useful as toners are described in U.S. Pat. No. 3,074,809 (Owen), U.S. Pat. No. 3,080,254 (Grant, Jr.), U.S. Pat. No. 3,446,648 (Workman), U.S. Pat. No. 3,844,797 (Willems et al.), U.S. Pat. No. 3,847,612 (Winslow), U.S. Pat. No. 3,951,660 (Hagemann et al.), U.S. Pat. No. 4,082,901 (Laridon et al.), U.S. Pat. No. 4,123,282 (Winslow), U.S. Pat. No. 5,599,647 (Defieuw et al.), and GB 1,439,478 (Afga).

Additional useful toners are substituted and unsubstituted mercaptotriazoles as described in U.S. Pat. No. 3,832,186 (Masuda et al.), U.S. Pat. No. 5,149,620 (Simpson et al.), U.S. Pat. No. 6,165,704 (Miyake et al.), U.S. Pat. No. 6,713,240 (Lynch et al.), and U.S. Pat. No. 6,841,343 (Lynch et al.), all of which are incorporated herein by reference in their entirety.

Phthalazine and phthalazine derivatives, such as those described in U.S. Pat. No. 6,146,822 (Asanuma et al.), which is incorporated herein by reference in its entirety, are particularly useful toners.

A combination of one or more hydroxyphthalic acids and one or more phthalazinone compounds can be included in the thermographic materials. Hydroxyphthalic acid compounds have a single hydroxy substituent that is in the meta position to at least one of the carboxy groups. Preferably, these compounds have a hydroxy group in the 4-position and carboxy groups in the 1- and 2-positions. The hydroxyphthalic acids can be further substituted in other positions of the benzene ring as long as the substituents do not adversely affect their intended effects in the thermographic material. Mixtures of hydroxyphthalic acids can be used if desired.

Useful phthalazinone compounds are those having sufficient solubility to completely dissolve in the formulation from which they are coated. Preferred phthalazinone compounds include 6,7-dimethoxy-1-(2H)-phthalazinone, 4-(4-pentylphenyl)-1-(2H)-phthalazinone, and 4-(4-cyclohexylphenyl)-1-(2H)-phthalazinone. Mixtures of such phthalazinone compounds can be used if desired.

This combination facilitates obtaining a stable bluish-black image after processing. In preferred embodiments, the molar ratio of phthalazinone to hydroxyphthalic acid is from about 1:1 to about 3:1. More preferably the ratio is from about 2:1 to about 3:1.

The direct thermographic materials may also include one or more thermal solvents (or melt formers). Combinations of these compounds can also be used, such as a combination of succinimide and dimethylurea. Known thermal solvents are disclosed in U.S. Pat. No. 3,438,776 (Yudelson), U.S. Pat. No. 5,250,386 (Aono et al.), U.S. Pat. No. 5,368,979 (Freedman et al.), U.S. Pat. No. 5,716,772 (Taguchi et al.), and U.S. Pat. No. 6,013,420 (Wingender).

The thermographic materials can also include one or more image stabilizing compounds that are usually incorporated in a "backside" layer. Such compounds can include phthalazinone and its derivatives, pyridazine and its derivatives, benzoxazine and benzoxazine derivatives, benzothiazine-dione and its derivatives, and quinazoline-dione and its derivatives, particularly as described in U.S. Pat. No. 6,599,685 (Kong). Other useful backside image stabilizers include anthracene compounds, coumarin compounds, benzophenone compounds, benzotriazole compounds, naphthalic acid imide compounds, pyrazoline compounds, or compounds described in U.S. Pat. No. 6,465,162 (Kong et al.) and GB 1,565,043 (Fuji Photo).

The thermographic materials may also include one or more additional polycarboxylic acids (other than the hydroxyphthalic acids noted above) and/or anhydrides thereof that are in thermal working relationship with the sources of reducible silver ions in the one or more thermographic layers. Such polycarboxylic acids can be substituted or unsubstituted aliphatic (such as glutaric acid and adipic acid) or aromatic compounds and can be present in an amount of at least 5 mol % ratio to silver. They can be used in anhydride or partially esterified form as long as two free carboxylic acids remain in the molecule. Useful polycarboxylic acids are described for example in U.S. Pat. No. 6,096,486 (Emmers et al.).

Binders

The source(s) of reducible silver ions, the reducing agent(s), toners, and any other additives may be combined with one or more polyvinyl acetal binders, which may be hydrophobic in nature. Either aqueous or organic solvent-based formulations can be used to prepare the thermally developable materials.

The polyvinyl acetals are the predominant binders in the thermally developable layers, meaning that they comprise between about 50% by weight and about 100% by weight of the total binder weight, between about 50% by weight and about 90% by weight of the total binder weight, etc. Polyvinyl acetal is the generic name for the class of polymers formed by the reaction of polyvinyl alcohol with one or more aldehydes. Polyvinyl acetal is also the name for the specific member of this class formed by reaction of polyvinyl alcohol and acetaldehyde. Typically, the aldehyde is formaldehyde or an aliphatic aldehyde having 2 to 4 carbon atoms. Acetaldehyde and butyraldehyde are commonly used aldehydes and form polyvinyl acetal (the specific polymer) and polyvinyl butyral respectively. In one exemplary embodiment, the polyvinyl acetal is polyvinyl butyral, polyvinyl acetal, or mixtures thereof.

In some embodiments, the binder may comprise a polyvinyl butyral resin, such as shown below.

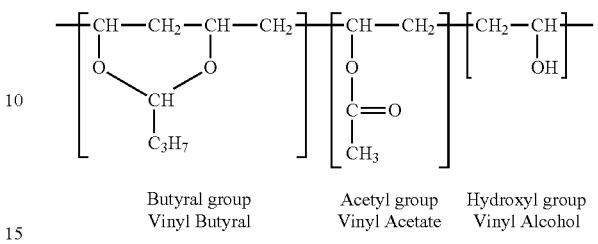

Butyral group  Acetyl group  Hydroxyl group
Vinyl Butyral  Vinyl Acetate  Vinyl Alcohol Such a binder may be prepared by a reaction of one or more polyvinyl alcohol hydroxyl groups and an aldehyde, such as butyraldehyde. In general, a polymer containing vinyl alcohol repeat units may also contain vinyl acetate repeat units, since the vinyl alcohol repeat units are generally formed from at least some of the vinyl acetate repeat units in the polymer by, for example, hydrolysis. The reaction of the hydroxyl groups with the aldehyde may be represented as:

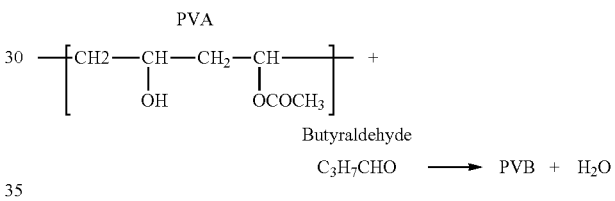

where PVA represents polyvinyl alcohol and PVB represents the resulting polyvinyl butyral resin.

Since the complete reaction of polymeric hydroxyl groups with the aldehyde may not take place, the product polymer may also comprise vinyl alcohol and vinyl acetate repeat units in addition to the vinyl butyral repeat units, as shown above. In some embodiments, the binder may comprise at least one butyral group, at least one acetyl group, and optionally, at least one hydroxyl group. In some embodiments, the binder may be a terpolymer of monomers comprising vinyl butyral, vinyl alcohol, and optionally, vinyl acetate. In some embodiments, binders may comprise copolymers of at least one first repeat unit comprising repeat units derived from at least one vinyl alcohol, at least one second repeat unit comprising repeat units derived from at least one butyraldehyde, and optionally at least one third repeat unit comprising repeat units derived from at least one vinyl acetate.

The characteristics and properties of polyvinyl butyral by itself or in a mixture to form the silver layer comprising a photosensitive catalyst may affect the silver efficiency, print stability, or accelerated aging of the film that comprises the silver layer. These properties include, but are not limited to, molecular weight, vinyl alcohol composition in terms of mol % or mole fraction, solution viscosity, total binder weight or concentration, weight fraction of the binders if more than one is being used, and glass transition temperature. These properties may be interrelated in their effect on the silver efficiency, print stability, or accelerated aging of the film.

Additional ("secondary") hydrophobic binders can be used in the thermographic layers if desired. Examples of typical secondary hydrophobic binders include low molecular weight polyvinyl acetal resins, polyvinyl chloride, polyvinyl acetate, cellulose acetate, cellulose acetate butyral, polyolefins, polyesters, polystyrenes, polyacrylonitrile, polycarbonates, methacrylate copolymers, maleic anhydride ester copolymers, butadiene-styrene copolymers, and other materials readily apparent to one skilled in the art.

Hardeners for various binders may be present in any layer of the thermally developable material if desired. Useful hardeners including crosslinking agents, are well known and include polyisocyanate compounds as described in EP 0 600 586 B1 (3M) and U.S. Pat. No. 6,313,065 (Horsten et al.), vinyl sulfone compounds as described in U.S. Pat. No. 6,143,487 (Philip, Jr. et al.) and EP 0 640 589 A1 (Eastman Kodak), and aldehydes and various other hardeners as described in U.S. Pat. No. 6,190,822 (Dickerson et al.).

The use of polyisocyanates to crosslink the polyvinyl acetal binder permits the use of lower polymerized polyvinyl acetal binders in the thermographic emulsion layers. When such crosslinking agents are used, a polyvinyl acetal having a degree polymerization of about 500 or more can be used. Preferred isocyanates are those described below as crosslinkers for the non-light-sensitive adhesive layer. Aromatic polyisocyanates are more preferred.

The non-imaging layers of the thermally developable materials can also include one or more of the same or different hydrophobic binders as described above for the imaging layer. Binders particularly useful for various backside layers and frontside overcoats are described below.

The polymer binder(s) is used in the thermally developable layer in an amount sufficient to carry the components dispersed therein. The total binders may comprise from about 10% to about 90% by weight (more preferably at a level of from about 20% to about 70% by weight) of the total dry weight of the layer.

Support Materials

The thermally developable materials may comprise a polymeric support that is preferably a flexible, transparent film that has any desired thickness and is composed of one or more polymeric materials, depending upon their use. The supports are generally transparent (especially if the material is used as a photomask) or at least translucent, but in some instances, opaque supports may be useful. They are required to exhibit dimensional stability during thermal imaging and development and to have suitable adhesive properties with overlying layers. Useful polymeric materials for making such supports include polyesters, cellulose acetate and other cellulose esters, polyvinyl acetal, polyolefins, polycarbonates, and polystyrenes. Exemplary supports are composed of polyesters such as polyethylene terephthalate film or polycarbonates.

Opaque supports can also be used, such as dyed polymeric films and resin-coated papers that are stable to high temperatures. Support materials can contain various colorants, pigments, and dyes if desired. For example, the support can contain conventional blue dyes that differ in absorbance from colorants in the various frontside or backside layers. Support materials may be treated using conventional procedures (such as corona discharge) to improve adhesion of overlying layers, or subbing or other adhesion-promoting layers can be used.

The support thickness can be within the range of from about 2 to about 15 μm. Preferably, the support thickness is from about 4 to about 10 μm.

Isocyanate Crosslinker

In some embodiments, the silver layer, which is a light-sensitive layer, may comprise a crosslinking agent or a crosslinker that is capable of binding a binder molecule through cross linking. Without wishing to be bound by theory, it is believed that employing a crosslinking agent for the binders may improve film adhesion. It is further believed that a crosslinking agent may reduce unevenness in the developed image, fogging during storage of the film, and printout silver formation after development. Any of the various crosslinking agents may be used, including, for example, those compounds comprising an aldehyde group, an epoxy group, an ethyleneimine group, a vinylsulfone group, a sulfonic acid ester group, an acryloyl group, a carbodiimide group, or a silane group. In some embodiments, the compound may be an isocyanate compound that comprises at least one isocyanate group. In some embodiments, the compound may be an isocyanate compound that comprises two isocyanate groups.

The isocyanate compound may, for example, be an aliphatic diisocyanate, an aliphatic diisocyanate having at least one cyclic group, benzene diisocyanate, naphthalene diisocyanate, biphenyl isocyanate, diphenylmethane diisocyanate, triphenylmethane diisocyanate, a triisocyanate, or a tetraisocyanate. In some embodiments, the isocyanate compound may be a hexamethylene diisocyanate, such as a 1,6-hexamethylene diisocyanate or trimer hexamethylene diisocyanate (THDI), as shown below.

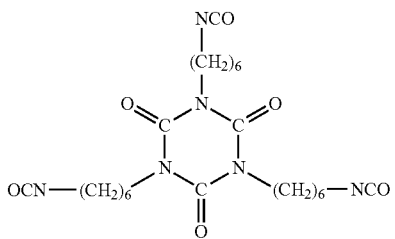

In some cases, the isocyanate compound may be poly(1,6-hexamethylene diisocyanate) and comprise 1,6-hexamethylene diisocyanate repeat units.

Without wishing to be bound by theory, it is believed that the reaction of an isocyanate group of the crosslinking agent and an alcohol group of the binder contributes to improved interlayer adhesion.

The isocyanate compound may be placed in any layer of the film. For example, it can be added to the photosensitive layer, surface protection layer, intermediate layer, anti-halation layer, under coating layer, or support. It can be added to one, two, or more layers in these layers.

Non-Photosensitive Carrier Layers

A non-photosensitive carrier layer, or undercoat layer, comprises one or more layers applied to a substrate layer upon which an emulsion layer is coated. A non-photosensitive carrier layer in some embodiments comprises polyethylene, polyvinyl butyral, and polyvinyl alcohol compounds. In some embodiments, a crosslinker containing isocyanate repeat units is added to the mixture of polyethylene, polyvinyl butyral, and polyvinyl alcohol compounds. In some embodiments, at least one non-photosensitive carrier layer is applied to the support before, or, in other embodiments, sequentially with, the emulsion layer and topcoat layer.

Without wishing to be bound by theory, it is believed that the reaction of an isocyanate group of the crosslinking agent and an alcohol group of the binder contributes to improved adhesion between the non-photosensitive carrier layer and other layers.

EXEMPLARY EMBODIMENTS

U.S. Provisional Patent Application No. 62/169,707, filed Jun. 2, 2015, entitled "THERMALLY DEVELOPABLE IMAGING MATERIALS AND METHODS," which is hereby incorporated by reference in its entirety, disclosed the following 46 non-limiting exemplary embodiments:

A. A thermally developable material comprising a support and having thereon at least one non-photosensitive carrier layer; and
   at least one thermally developable imaging layer comprising organic silver salt grains, light-sensitive silver halide grains, at least one reducing agent, at least one first binder comprising hydroxyl and butryal repeat units, and at least one first crosslinker comprising at least one isocyanate group.

B. The material of embodiment A wherein the at least one non-photosensitive carrier layer comprises a mixture of at least one second binder comprising at least one butyral and at least one alcohol functional group, and at least one adhesion promoting compound.

C. The material of embodiment B wherein the said mixture further comprises at least one second crosslinker.

D. The material of embodiment C wherein the at least one second crosslinker comprises at least one isocyanate group.

E. The material of embodiment D, wherein the at least isocyanate group comprises one or more isocyanate repeat units.

F. The material of embodiment C, wherein the at least one second crosslinker comprises hexamethylene diisocyanate.

G. The material of embodiment C, wherein the at least one second crosslinker comprises 1,6-hexamethylene diisocyanate.

H. The material of embodiment C, wherein the at least one second crosslinker comprises a trimer of hexamethylene diisocyanate.

J. The material of embodiment B, wherein the at least one second binder comprises a terpolymer with butyral, alcohol, and acetate repeat units randomly distributed along its backbone.

K. The material of embodiment J, wherein the weight ratio of vinyl alcohol repeat units to vinyl butyral repeat units is about 1:5.

L. The material of embodiment D, wherein the equivalent ratio of the vinyl alcohol repeat units in the at least one second binder to the isocyanate groups in the at least one second crosslinker has an upper bound about 56.

M. The material of embodiment D wherein the equivalent ratio of the vinyl alcohol repeat units in the at least one second binder to the isocyanate groups in the at least one second crosslinker is between about 14 and about 28.

N. The material of embodiment D wherein the equivalent ratio of the vinyl alcohol repeat units in the at least one second binder to the isocyanate groups in the at least one second crosslinker is about 14.

P. The material of embodiment A, wherein the at least one thermally developable imaging layer additionally comprises polyvinylpyrrolidone/vinyl acetate (PVP-VA).

Q. The material of embodiment P, wherein, in the at least one thermally developable imaging layer, the weight ratio of polyvinylpyrrolidone/vinyl acetate (PVP-VA) to PVB (polyvinyl butyral) is about 1:21.

R. The material of embodiment B wherein the at least one adhesion promoting compound comprises ester groups.

S. The material of embodiment R wherein the at least one adhesion promoting compound comprises polyester.

T. The material of embodiment B, wherein the at least one second binder is the material of embodiment 10 and the at least one adhesion promoting agent is the material of embodiment 17 and the weight ratio of the at least one adhesion promoting agent to the at least one binder is about 1:2.3.

U. A thermally developable material comprising a support and having thereon
   at least one non-photosensitive carrier layer,
   at least one thermally developable imaging layer comprising organic silver salt grains, light-sensitive silver halide grains, at least one reducing agent, at least one first binder comprising hydroxyl and butryal repeat units, and at least one first crosslinker comprising at least one first isocyanate group, and
   at least one topcoat layer.

V. The material of embodiment U wherein the at least one non-photosensitive carrier layer comprises a mixture of at least one second binder comprising at least one butyral and at least one alcohol functional group, and at least one adhesion promoting compound.

W. The material of embodiment V wherein the said mixture further comprises at least one second crosslinker X. The material of embodiment W wherein the at least one second crosslinker comprises at least one second isocyanate group.

Y. The material of embodiment X, wherein the at least one second isocyanate group comprises isocyanate repeat units.

Z. The material of embodiment W, wherein the at least one second crosslinker comprises hexamethylene diisocyanate.

AA. The material of embodiment W, wherein the at least one second crosslinker comprises 1,6-hexamethylene diisocyanate.

AB. The material of embodiment W, wherein the at least one second crosslinker comprises a trimer of hexamethylene diisocyanate.

AC. The material of embodiment V, wherein the at least one second binder comprises a terpolymer with butyral, alcohol, and acetate repeat units that are randomly distributed along the polymer backbone.

AD. The material of embodiment AC, wherein the weight ratio of vinyl alcohol repeat units to vinyl butyral repeat units is about 1:5.

AE. The material of embodiment X, wherein the equivalent ratio of the vinyl alcohol repeat units in the at least one binder to the isocyanate groups in the at least one crosslinker, has an upper bound of about 56.

AF. The material of embodiment X wherein the equivalent ratio of the vinyl alcohol repeat units in the at least one binder to the isocyanate groups in the at least one crosslinker is between about 14 and about 28.

AG. The material of embodiment X wherein the equivalent ratio of the vinyl alcohol repeat units in the at least one second binder to the isocyanate groups in the at least one second crosslinker is about 14.

AH. The material of embodiment U wherein the at least one thermally developable imaging layer additionally comprises polyvinylpyrrolidone/vinyl acetate (PVP-VA).

AJ. The material of embodiment X wherein the weight ratio of polyvinylpyrrolidone/vinyl acetate (PVP-VA) to PVB (polyvinyl butyral) is about 1:21.

AK. The material of embodiment V wherein the at least one adhesion promoting compound comprises ester groups.

AL. The material of embodiment AK wherein the at least one adhesion promoting compound comprises polyester.

AM. The material of embodiment V, wherein the at least one second binder is the material of embodiment AD and the at least one adhesion promoting agent is the material of embodiment AL and the weight ratio of the at least one adhesion promoting agent to the at least one binder is about 1:2.3.

AN. A method for preparation of the photothermographic material of embodiment A comprising:
sequential coating of a transparent substrate with at least one non-photosensitive carrier layer; and
simultaneous coating of said non-photosensitive carrier layer with at least one thermally developable imaging layer.

AP. The method of embodiment AN, wherein the time allotted between the coating of the at least one non-photosensitive carrier layer and the coating of the at least one thermally developable imaging layer is between about 0 and 24 hours.

AQ. The method of embodiment AN, wherein the time allotted between the coating of the at least one non-photosensitive carrier layer and the coating of the at least one thermally developable imaging is about 24 hours.

AR. The method of embodiment AN, wherein the time elapsed between the formulation and mixing of the at least one non-photosensitive carrier layer mix and its application to the substrate is between zero and thirty-six days.

AS. The method of embodiment AN, wherein the time elapsed between the formulation and mixing of the at least one non-photosensitive carrier layer mix and its application to the substrate about thirty-six days.

AT. A method for preparation of the photothermographic material of embodiment R comprising:
sequential coating of a transparent substrate with at least one non-photosensitive carrier layer;
coating of said non-photosensitive carrier layer with at least one thermally developable imaging layer; and
coating of at least one topcoat layer.

AU. The method of embodiment AT, wherein the time allotted between the coating of the at least one non-photosensitive carrier layer and the simultaneous coating of the at least one thermally developable imaging layer and topcoat layer is between about 0 and 24 hours AV. The method of embodiment AT, wherein the time allotted between the coating of the at least one non-photosensitive carrier layer and the simultaneous coating of the at least one thermally developable imaging layer and topcoat layer is about 24 hours.

AW. The method of embodiment AT, wherein the time elapsed between the formulation and mixing of the at least one non-photosensitive carrier layer mix and its application to the substrate is between zero and thirty-six days.

AX. The method of embodiment AT, wherein the time elapsed between the formulation and mixing of the at least one non-photosensitive carrier layer mix and its application to the substrate about thirty-six days.

EXAMPLES

Materials

All materials used in the following examples are readily available from standard commercial sources, such as Sigma-Aldrich Co. LLC unless otherwise specified.

Polyvinyl butyral resins are, frequently marketed using a nomenclature that is consistent, at least within each company's product line. The trade name is followed by a letter indicating the aldehyde used. For example, a capital "B" denotes the use of butyraldehyde. This letter is followed by a number based on the resin's degree of polymerization, with higher numbers indicating higher degrees of polymerization. The suffixes T, M, H, S, and HH denote the extent of acetalization, with T being the lowest and HH being the highest. Thus, a company's B14S resin has a lower degree of polymerization and a lower extent of acetalization, than, for example, its B60HH resin.

B03TX is a polyvinyl butyral resin having a hydroxyl content of 16-20 wt %, maximum acetate content of 3 wt %, maximum free acid content of 0.05 wt %, maximum volatile content of 3 wt %, and weight average molecular weight of approximately 23,000 g/mol. B03TX is available from Chang Chun PetroChemical Co., Ltd. under the trade name CCP B03TX PVB.

B45H is a polyvinyl butyral resin having a non-volatile content of at least 97.5 wt %, hydroxyl group (vinyl alcohol group) content from about 18 wt % to about 21 wt %, acetyl group (vinyl acetate group) content from about 1 wt % to about 4 wt %, and weight average molecular weight of approximately 40,000 g/mol. B45H is available from Kuraray Europe GmbH, BU PVB under the trade name MOWITAL® PIOLOFORM® B 45 H PVB. B03TX has a LOWER molecular weight and a HIGHER glass transition temperature than B45H, which has a glass transition temperature of about 69 degrees Celsius.

B60HH is a polyvinyl butyral resin having a non-volatile content of at least 97.5 wt %, hydroxyl group (vinyl alcohol group) content from about 12 wt % to about 16 wt %, acetyl group (vinyl acetate group) content from about 1 wt % to about 4 wt %, and a weight average molecular weight of approximately 55,000 g/mol. B60HH is available from Kuraray Europe GmbH, BU PVB under the trade name MOWITAL® PIOLOFORM® B 60 HH PVB.

B14S is a polyvinyl butyral resin having a non-volatile content of 97.5 wt %, polyvinyl alcohol content of about 14-18 wt %, polyvinyl acetate content of about 5-8 wt %, and the bulk density of about 340 g/L. B14S is available from Kuraray Europe GmbH, BU PVB under the trade name MOWITAL® PIOLOFORM® B 14 S PVB.

B16H is a polyvinyl butyral resin having a non-volatile content of 97.5 wt %, polyvinyl alcohol content of about 18-21 wt %, polyvinyl acetate content of about 1-4 wt %, and weight average molecular weight of approximately 15,000 g/mol. B16H is available from Kuraray Europe GmbH, BU PVB under the trade name MOWITAL® PIOLOFORM® B 16 H PVB.

B20H is a polyvinyl butyral resin having a non-volatile content of 97.5 wt %, polyvinyl alcohol content of about 18-21 wt %, polyvinyl acetate content of about 1-4 wt %, and the bulk density of about 330 g/L. B20HH is available from Kuraray Europe GmbH, BU PVB under the trade name MOWITAL® PIOLOFORM® B 20 H PVB.

DESMODUR® N 3300A is a solvent free polyfunctional aliphatic isocyanate resin based on 1,6-hexamethylene diisocyanate (HDI). It is of the HDI trimer type. It is available from Bayer MaterialScience LLC. The average equivalent weight is 193 g/mol. The NCO group content is 21.8%±0.3%. The monomeric HDI content is a maximum of 0.2%.

THDI is a trimer of 1,6-hexamethylene diisocyanate.
MEK is methyl ethyl ketone (or 2-butanone).
MeOH is methanol.
BZT is benzotriazole.
PARALOID® A-21 is an acrylic polymer available from Dow Chemical Company. A-21 is a powder and has a glass transition temperature of about 105 degrees Celsius and a bulk density at 25 degrees C. of 9.8 lb/gallon.

CAO-5 is bis(2-hydroxy-3-t-butyl-5-methylphenyl)methane, available from Sigma-Aldrich. It has the following structure:

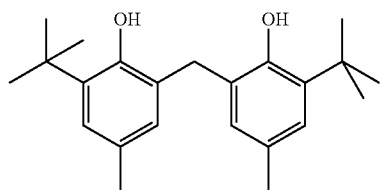 [SMILES: Cc1cc(Cc2cc(C)cc(C(C)(C)C)c2O)c(O)c(C(C)(C)C)c1]

Trisphenol, available from BOC Sciences (Shirley, N.Y.), has the following structure:

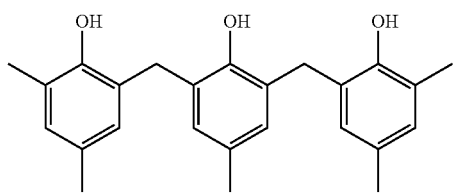

Irganox 1010 is a sterically hindered phenolic antioxidant that is available from commercial sources, such as Akrochem Corp., BASF Corp., or Chitec Tech. Corp. It has the following structure:

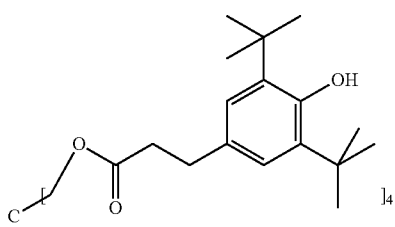 [SMILES: CCOC(=O)CCc1cc(C(C)(C)C)c(O)c(C(C)(C)C)c1]

AD-1 is an IR Acutance Dye that is available from KP Synchem. It has the following structure:

(AD-1)

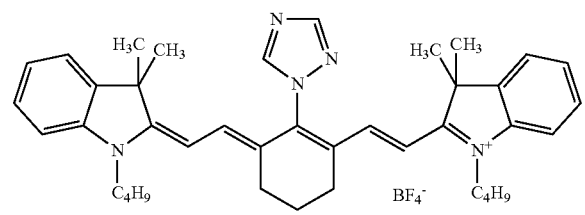

Sensitizing Dye A is described in U.S. Pat. No. 5,541,054 (Miller et al.) has the structure shown below.

(Sentizing Dye A)

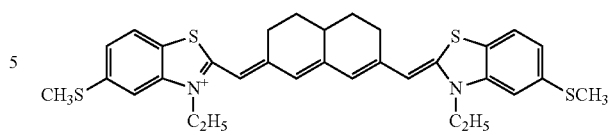

TD-1 is a tinting dye with the following structure:

(TD-1)

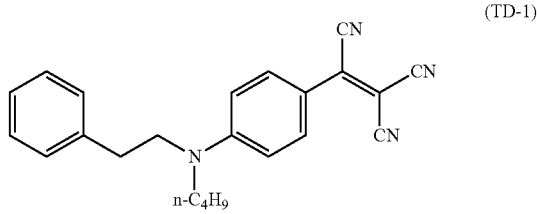

SD-1 is a support dye with the following structure:

(SD-1)

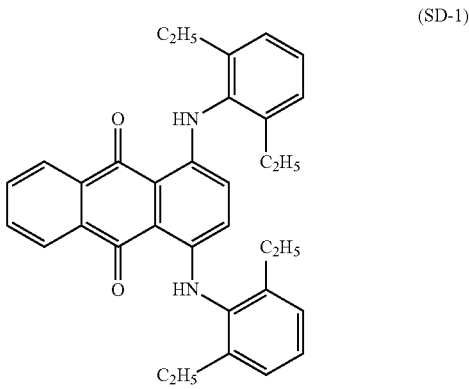

PHP is pyridinium hydrobromide perbromide.

PE5833B is a low molecular weight, branched saturated polyester resin. It is a clear to pale yellow resin with an intrinsic viscosity of about 0.18 dL/g and a specific gravity of about 1.26. The glass transition temperature is about 48° C. Its weight average and number average molecular weights are 9,800 g/mol and 4,600 g/mol, respectively. It is available under the trade name VITEL from Bostik, Inc., 211 Boston Road, Middleton, Mass. 01949.

Sokalan VA 64P (currently Luviskol VA64P) is a polyvinypyrrolidone/polyvinyl acetate (PVP/VA) copolymer available from BASF. The relative ratio of VP to VA repeat groups is about 60:40. It is available as a white powder that forms a clear solution in water and has a K-value (in 1% ethanol) of about 26.0-34.0.

Boai Nyk VA 64P is a polyvinylpyrrolidone/polyvinyl acetate (PVP/VA) copolymer available from Boai Nyk Pharmaceuticals under the trade name KoVidone VA64. The USP name is Copovidone and the EP name of Copovidonum. It has a K-value of about 25.02-30.8. It is a white or creamy white free flowing powder with an a vinyl alcohol (VA) content of about 35.3-42.0% and a nitrogen content of 7.0-8.0%.

Methods

Preparation of Photothermographic Emulsion Formulations

A preformed silver halide, silver carboxylate soap dispersion, was prepared in similar fashion to that described in U.S. Pat. No. 5,939,249, US Patent Application Publication No. 2008/0057450, and US Patent Application Publication No. 2009/0081578, which are hereby incorporated by reference herein in their entirety. The preformed silver halide, silver carboxylate soap dispersion was made by mixing preformed silver halide, silver carboxylate soap, B60HH PVB resin, and MEK. The dispersion was homogenized to form a homogenate of 29.42% solids.

Procedure (1):

The homogenate was mixed at a temperature of 67° F. and mixing rate of 400 rpm. To 168.60 parts of the homogenate, a solution of 0.238 parts of PHP in 1.35 parts methanol was added with continued stirring. After 45 minutes of mixing, a solution of 0.232 parts of zinc bromide in 1.86 parts of methanol was added. Stirring was continued, and after 30 minutes, a solution of 0.150 parts of 2-mercapto-5-methyl-benzimidazole, 0.0073 parts Sensitizing Dye A, 1.66 parts of 2-(4-chlorobenzoyl)benzoic acid, 10.81 parts of methanol, and 3.78 parts of methyl ethyl ketone was added.

After stirring for 60 minutes, the temperature was lowered to 50° F. A selected mixture of PVB resins consisting of 22.99 parts B34H and 22.9 parts B03TX was and mixed for 15 minutes at a mixing rate of between about 800 rpm and about 1200 rpm.

Solution A, Developer Solution, Solution B, and Solution C were added to each of the emulsion formulation samples and mixed at a mixing rate of 1200 rpm, 5 minutes apart. Solution D was added and mixed at a mixing rate of 1200 rpm for 20 minutes.

Solution A

| 2-(Tribromomethylsulphonyl)pyridine | 0.806 parts |
| Tetrachlorophthalic acid | 0.369 parts |
| 4-Methylphthalic acid | 0.717 parts |
| MEK | 16.314 parts |
| MeOH | 0.282 parts |

Developer Solution

| CAO-5 | 2.10 parts |
| Trisphenol | 2.67 parts |
| Irganox 1010 | 7.53 parts |

Solution B

| THDI | 0.658 parts |
| MEK | 0.328 parts |

Solution C

| Phthalazine | 1.325 parts |
| MEK | 6.290 parts |

Solution D

| Maleic Acid | 0.043 parts |
| MEK | 1.177 parts |

Procedure (2):

The 167.0 parts of the homogenate and 31.8 parts of MEK were mixed at a temperature 67° F. and mixing rate of 400 rpm for 10 minutes. To the homogenate solution, a solution of 0.238 parts PUP in 1.35 parts methanol was added with continued stirring. After 45 minutes of mixing, a solution of 0.232 parts of zinc bromide in 1.86 parts of methanol was added. Stirring was continued, and after 30 minutes, a solution of 0.150 parts of 2-mercapto-5-methylbenzimidazole, 0.0073 parts Sensitizing Dye A, 1.66 parts of 2-(4-chlorobenzoyl)benzoic acid, 10.81 parts of methanol, and 3.78 parts of MEK was added.

After stirring for 60 minutes, solution A, as described below, was added and mixed at a rate of 400 rpm for 5 minutes as the temperature dropped to a temperature below 67° F. 2.3 parts of a PVP-VA resin were added to the mix and stirred at a rate of 500 rpm for 5 minutes as the temperature of the mix cooled to, and was then maintained at, a temperature of 50° F.

A PVB resin composition was added and mixed for 15 minutes at a mixing rate of between about 800 rpm and about 1200 rpm. The PVB resin mixtures added were specific to each of the examples 1, 2, and 3. The content of these mixtures relevant to each example are described in the Examples section.

Solution A, Developer Solution, Solution B, and Solution C were added to each of the emulsion formulation samples and mixed at a mixing rate of 1200 rpm, 5 minutes apart. Solution D was added and mixed at a mixing rate of 1200 rpm for 20 minutes.

Solution A

| 2-(Tribromomethylsulphonyl)pyridine | 0.806 parts |
| Tetrachlorophthalic acid | 0.369 parts |
| 4-Methylphthalic acid | 0.717 parts |
| MEK | 16.314 parts |
| MeOH | 0.282 parts |

Developer Solution

| CAO-5 | 2.10 parts |
| Trisphenol | 2.67 parts |
| Irganox 1010 | 7.53 parts |

Solution B

| THDI | 0.658 parts |
| MEK | 0.328 parts |

Solution C

| Phthalazine | 1.325 parts |
| MEK | 6.290 parts |

Solution D

| Maleic Acid | 0.043 parts |
| MEK | 1.177 parts |

Preparation of Top Coat Formulations

A top coat formulation was prepared for each of samples by adding the materials below.

| Polymer Premix | 401.44 parts |
| MEK | 92.178% |

-continued

| | |
|---|---|
| PARALOID ® A-21 | 0.657% |
| Cellulose acetate butyral | 7.165% |
| Ethyl 2-cyano-3-hydroxy-butanoate | 0.723 parts |
| 1,3-Bis(vinylsulfonyl)-2-propanol | 1.323 parts |
| BZT | 0.815 parts |
| THDI premix | 3.220 parts |
| MEK | 42.03 parts |
| TD-1 | 0.0184 parts |
| AD-1 | 0.434 parts |

Preparation of Carrier Formulations

The carrier solution was prepared by adding all resins (and the THDI and A21, if applicable, see Examples) into a glass jar, and then placed on a shaker for a minimum of one hour. Once the solution was prepared a #3 Mayer rod was used to apply the non-photosensitive carrier layer onto a 7 mil (about 178 μm) polyethylene terephthalate support, tinted blue with support dye SD-1. The applied layer was dried for one minute at 100 degrees C. The non-photosensitive carrier layer had an average coating weight of about 0.41 grams per square meter (g/m$^2$). The backside of the support had been pre-coated with an antihalation and antistatic layer having an absorbance greater than 0.3 between 805 and 815 nm, and a resistivity of less than $10^{11}$ ohms/square.

Preparation of Photothermographic Materials

The emulsion layers and top coat formulations were simultaneously coated onto the non-photosensitive carrier layer. An automated dual knife coater equipped with an in-line dryer was used. Immediately after coating, samples were dried in a forced air oven at about 100° C. for about 5 minutes. The photothermographic emulsion formulation was coated to obtain a coating weight between about 1.65 and 2.00 g of total silver/m$^2$. The overcoat formulation was coated to obtain about a dry coating weight of about 0.2 g/ft$^2$ (2.2 g/m$^2$) and an absorbance in the imaging layer of between 0.9 and 1.35 at 810 μm.

Development of Photothermographic Materials

Samples of each photothermographic material were cut into strips, exposed with a laser sensitometer at 810 nm, and thermally developed to generate continuous tone wedges with image densities varying from a minimum density (Drain) to a maximum density (Dmax) possible for the exposure source and development conditions. Development was carried out on a 6 inch diameter (15.2 cm) heated rotating drum. The strip contacted the drum for 210 degrees of its revolution, about 11 inches (28 cm). Samples were developed at 122.5° C. for 15 seconds at a rate of 0.733 inches/sec (112 cm/min). A strip sample of each photothermographic material was scanned using a computerized densitometer equipped with both a visible filter and a blue filter having peak transmission at about 440 nm.

Measurement of Adhesion of Coated Substrates Test Method

A sheet with a minimum area of 10 inches by 10 inches was processed to $D_{max}$ and allowed to cool for 1 hour. In a location conveniently close to a light box, sample sheets were placed coating side up on a flat surface. A cutting tool was used to cut through the coating to the substrate using a continuous motion and even pressure. Consecutive strokes were used to create a perpendicular crosshatch pattern. When the crosshatch pattern was complete, a cotton pad was used to eliminate debris. The sample was placed on a light box, and the reflected and transmitted light coming through the test area was examined. A piece of tape approximately 3 inches long was then cut and placed on the crosshatch pattern and smoothed into position with a plastic squeegee, rubber roller, or other appropriate tool. Care was taken to remove air bubbles. The tape was immediately removed after placing in a swift, non-jerking motion at an angle of 180 degrees to the substrate. The test area was then inspected for removal of emulsion from the carrier, or topcoat from the emulsion, depending which test was performed. The test results were compared against the ASTM International D3359 standard, as depicted in FIG. 1. The scale (1-5), shown in the Classification column of FIG. 1, was used to classify the $D_{max}$ carrier adhesion.

Example 1

Several samples of photothermographic material were prepared according to the preparations discussed in the method section. Samples 1 through 27, as described in Table 1, were prepared using variable amounts of PE5833B, B14S, THDI, and A21 in the non-photosensitive carrier layer, and with different compositions of the silver layer as described below.

The amount each of the non-photosensitive carrier layer components varied in each mixture is indicated by the respective weight ratios in Table 1. The total amount of resin component (PE5833B and B14S) in the mix can be determined by multiplying the weight ratio of the resin component, $Wt_{PB}$, by a standard mass of 11.0 grams. The weight ratio THDI, $Wt_{THDI}$, is the mass of THDI in the mix relative to 0.5 g. The weight ratio of A21, $Wt_{A21}$, is the mass of A21 in the mix relative to 1.0 g. As an example, a sample having a composition equal to 30 wt % PE5833B and 70 wt % B1.4S at a total weight ratio, $Wt_{PB}$, equal to 1, a weight ratio of THDI, equal to 1, a weight ratio of A21, $Wt_{A21}$, equal to 0, and 11.4% solids would have 3.3 grams of PE58339, 7.7 grams B14S, 0.5 grains THIN, 0.0 grams A21, and a total carrier formulation mass of 100.5 grams. As another example, a sample having 46.2 wt % PE5833B and 53.8 wt B14S at a total resin weight ratio, $Wt_{PB}$, equal to 1.26, a weight ratio of THDI, $Wt_{THDI}$, equal to 0, a weight ratio A21, $Wt_{A21}$, equal to 0, and 13.8% solids would have 6.6 grams of PE5833B, 7.7 grams of B14S, 0.0 grams THDI, 0.0 grams A21, and a total carrier formulation mass of 103.6 grams.

Sample carrier mixes were prepared using: (1) 30 wt. % RE5833B and 70 wt % B14S, $Wt_{PB}$=1.0, $Wt_{THDI}$=0.0, $Wt_{A21}$=0.0, and 11.0% solids (control); (2) 46.2 wt % PE5833B and 53.8 wt % B14S, $Wt_{PB}$=1.26, $Wt_{THDI}$=0.0, $Wt_{A21}$=0.0, with 13.8% solids; (3) 30 wt % PE5833B and 70 wt % B14S, $Wt_{PB}$=1.0, $Wt_{THDI}$=1.0, $Wt_{A21}$=0.0, with 11.4% solids; and (4) 30 wt % PE5833B and 70 wt % B14S, $Wt_{PB}$=1.0, $Wt_{THDI}$=0.0, $Wt_{A21}$=1.0, with 12.0% solids. The solvent in these preparations was methyl ethyl ketone (MEK).

These mixes and their components are shown in Table 1. A non-photosensitive carrier layer formulated from these mixes was applied to the substrate, for each of the 27 samples shown in Table 1, using techniques outlined in the Methods section. To each of these carrier samples, a silver emulsion layer and topcoat layer were simultaneously applied as described in the Methods section, at a time delay relative to the coating of the non-photosensitive carrier layer as indicated in Table 1. The silver coating mixtures used to construct the silver layers were prepared as described in the procedure (1) and procedure (2) sections of the Methods section. Each applied silver coating layer contained a mixture of a standard silver formulation with a variable amount of PVP/PA or crosslinker as indicated in Table 1. These resin mixtures are described as follows:

Mixture 1:

30.0 parts B45H (Kuraray) and 30 parts of B03TX (CCP), prepared according to the method of procedure (1) outlined in the methods section.

Mixture 2:

2.3 parts PVP-VA (Sokalan, BASF), 10.35 parts B45H (Kuraray), 10.35 parts B20H (Kuraray), 27.59 parts B03TX (CCP), prepared according to the method of procedure (2) outlined in the methods section.

Mixture 3:

2.3 parts PVP-VA (BoaiNYK), 10.35 parts B45H (Kuraray), 10.35 parts B20H (Kuraray), 27.59 parts B03TX (CCP), prepared according to the method of procedure (2) outlined in the methods section.

Mixture 4:

2.3 parts PVP-VA (Sokalan, BASF), 10.35 parts B45H (Kuraray), 10.35 parts B20H (Kuraray), 27.59 parts B03TX (CCP) with proportion of MEK in mix reduced relative to Mixture 2 to form a higher viscosity compound, prepared according to the method of procedure (2) outlined in the methods section.

Mixture 5:

2.3 parts B03TX (CCP), 10.35 parts B45H (Kuraray), 10.35 parts B20H (Kuraray), 27.59 parts B03TX (CCP), prepared according to the method of procedure (2) outlined in the methods section.

Mixture 6:

2.3 parts B20H (Kuraray), 10.35 parts B45H (Kuraray), 10.35 parts B20H (Kuraray), 27.59 parts B03TX (CCP), prepared according to the method of procedure (2) outlined in the Methods section.

Mixture 7:

2.3 parts B45H (Kuraray), 10.35 parts B45H (Kuraray), 10.35 parts B20H (Kuraray), 27.59 parts B03TX (CCP), prepared according to the method of procedure (2) outlined in the Methods section.

Mixture 8:

10.8 parts B45H (Kuraray), 10.8 parts B20H (Kuraray), 28.9 parts B03TX (CCP), prepared according to the method of procedure (2) outlined in the Methods section.

Mixture 9:

Mixture 2 with 1.5 times the parts THDI in solution D as outlined in the methods section, prepared according to the method of procedure (2) outlined in the Methods section.

Mixture 10:

Mixture 5 with 1.5 times the parts THDI in solution D as described in the methods section, prepared according to the method of procedure (2) outlined in the Methods section.

Mixture 11:

Mixture 2 prepared according to the method of procedure (2) outlined in the Methods section, except that the Developer Solution of procedure (1) was substituted for the Developer Solution of procedure (2).

Mixture 12:

Mixture 2 prepared according the method of procedure (2) outlined in the Methods section, except that when the mixture of a solution of 0.150 parts of 2-mercapto-5-methylbenzimidazole, 0.0073 parts Sensitizing Dye A, 1.66 parts of 2-(4-chlorobenzoyl)benzoic acid, 10.81 parts of methanol, and 3.78 parts of methyl ethyl ketone was added, the mixture was stirred for two hours at a rate of 400 rounds per minute, instead of the prescribed 1 hour described in procedure (2).

In addition, the age of the carrier mix was varied as indicated in Table 1.

$D_{max}$ adhesion of the silver emulsion layer to the non-photosensitive carrier layer ($D_{max}$ Ag to Ag carrier), and $D_{max}$ adhesion of the topcoat layer to the silver emulsion layer ($D_{max}$ TC to Ag carrier), was then evaluated by techniques described in the Methods section. The result was a number from 1 through 5 listed in Table 1.

This example demonstrates that the addition of PVB/PVP-VA to the silver emulsion layer decreased the adhesion between layers (Samples 1-2 to 1-4, for example) as demonstrated by a low silver to carrier $D_{max}$ adhesion relative to the control (Sample 1-1). The example further demonstrates that addition of the THDI crosslinker to the non-photosensitive carrier layer mix improved adhesion between layers in the case where PVB/PVP-VA was present in the silver emulsion layer (compare Samples 1-5 and 1-3, for example). Additionally, it was found that a time delay of 24 hours between the application of the non-photosensitive carrier layer and the application of the silver emulsion layer (Samples 1-5 and 1-7, for example) improved the adhesion between layers, and more so if THDI was present in the non-photosensitive carrier layer (Sample 1-7, for example). The improvement in $D_{max}$ adhesion was not clearly associated with the addition of additional THDI into the silver emulsion mix, as is demonstrated by the data of Samples 1-22 to 1-24.

Example 2

Several samples of photothermographic material were prepared according to the preparations discussed in the methods section. The Samples in Table 2, labeled 2-1 through 2-31, were prepared using a resin mixture in the non-photosensitive carrier layer comprising 30 wt % PE5833B and 70 wt % B14S, and a variable amount of THDI in the non-photosensitive carrier layer. Additionally, the composition of the silver layer was varied in the samples as indicated in Table 2:

The total weight fraction of PE5833B and B14S in the resin component of the non-photosensitive carrier layer mixture was held constant at 30 wt % and 70 wt %, respectively. The total amount of resin component (PE5833B and B14S) in the mix can be determined by multiplying the weight ratio of the resin component, $Wt_{PB}$, by a standard mass of 11.0 grams. The amount of THDI in the carrier coat was varied, and the weight ratio used in the mix is listed relative to a standard weight of 0.5 grams. As an example, a sample having 30 wt % of PE5833B and 70 wt of B14S at a total weight ratio, $Wt_{PB}$, of 2.00, a weight ratio of THDI, $Wt_{THDI}$, of 4.0, and 11.9% solids would have 6.6 grams of PE5833B and 15.4 grams of B14S, 2.0 gram THDI, and a total carrier formulation mass of 202.0 grams.

TABLE 1

| Sample # | Carrier ID | Mixture | Carrier Age (hours) Fresh (f) | Wt % PE | Wt % PVB | Wt ratio PE and PVB ($WT_{PB}$) | Wt ratio THDI in carrier ($WT_{THDI}$) | Wt ratio A21 in carrier ($WT_{421}$) | $D_{max}$ Ag to Ag Carrier | $D_{max}$ TC to Ag |
|---|---|---|---|---|---|---|---|---|---|---|
| 1-1 | 1 | 1 | 24 | 30 | 70 | 1 | 0 | 0 | 4 | 3 |
| 1-2 | 1 | 2 | 24 | 30 | 70 | 1 | 0 | 0 | 0 | N/A |
| 1-3 | 1 | 2 | f | 30 | 70 | 1 | 0 | 0 | 0 | N/A |
| 1-4 | 2 | 2 | 24 | 46.2 | 53.8 | 1.3 | 0 | 0 | 0 | N/A |

TABLE 1-continued

| Sample # | Carrier ID | Mixture | Carrier Age (hours) Fresh (f) | Wt % PE | Wt % PVB | Wt ratio PE and PVB ($WT_{PB}$) | Wt ratio THDI in carrier ($WT_{THDI}$) | Wt ratio A21 in carrier ($WT_{A21}$) | $D_{max}$ Ag to Ag Carrier | $D_{max}$ TC to Ag |
|---|---|---|---|---|---|---|---|---|---|---|
| 1-5  | 3 | 2  | f  | 30   | 70   | 1   | 1 | 0 | 2 | 5 |
| 1-6  | 4 | 2  | f  | 30   | 70   | 1   | 0 | 1 | 0 | N/A |
| 1-7  | 3 | 2  | 24 | 30   | 70   | 1   | 1 | 0 | 5 | 3 |
| 1-8  | 1 | 3  | 24 | 30   | 70   | 1   | 0 | 0 | 0 | N/A |
| 1-9  | 1 | 4  | 24 | 30   | 70   | 1   | 0 | 0 | 0 | N/A |
| 1-10 | 1 | 5  | 24 | 30   | 70   | 1   | 0 | 0 | 5 | 3 |
| 1-11 | 1 | 5  | f  | 30   | 70   | 1   | 0 | 0 | 4 | 3 |
| 1-12 | 2 | 5  | 24 | 46.2 | 53.8 | 1.3 | 0 | 0 | 3 | 2 |
| 1-13 | 3 | 5  | 24 | 30   | 70   | 1   | 1 | 0 | 5 | 4 |
| 1-14 | 3 | 5  | f  | 30   | 70   | 1   | 1 | 0 | 4 | 4 |
| 1-15 | 4 | 5  | f  | 30   | 70   | 1   | 0 | 1 | 4 | 3 |
| 1-16 | 1 | 6  | 24 | 30   | 70   | 1   | 0 | 0 | 4 | 1 |
| 1-17 | 1 | 7  | 24 | 30   | 70   | 1   | 0 | 0 | 4 | 1 |
| 1-18 | 1 | 8  | 24 | 30   | 70   | 1   | 0 | 0 | 4 | 1 |
| 1-19 | 1 | 9  | 24 | 30   | 70   | 1   | 0 | 0 | 0 | N/A |
| 1-20 | 2 | 9  | 24 | 46.2 | 53.8 | 1.3 | 0 | 0 | 0 | N/A |
| 1-21 | 4 | 9  | 24 | 30   | 70   | 1   | 0 | 1 | 0 | N/A |
| 1-22 | 1 | 10 | 24 | 30   | 70   | 1   | 0 | 0 | 1 | 2 |
| 1-23 | 2 | 10 | 24 | 46.2 | 53.8 | 1.3 | 0 | 0 | 0 | 2 |
| 1-24 | 4 | 10 | 24 | 30   | 70   | 1   | 0 | 1 | 0 | 3 |
| 1-25 | 1 | 11 | 3  | 30   | 70   | 1   | 0 | 0 | 0 | N/A |
| 1-26 | 1 | 12 | 3  | 30   | 70   | 1   | 0 | 0 | 0 | N/A |
| 1-27 | 1 | 2  | 3  | 30   | 70   | 1   | 0 | 0 | 0 | N/A |

Sample carrier mixes were prepared using: (1) 30 wt % PE5833B and 70 wt % B14S, $Wt_{PB}$=1.00 $Wt_{THDI}$=0.0, and 11.0% solids (control); (2) 30 wt PE5833B and 70 wt % B14S with $Wt_{PB}$=1.00, $Wt_{THDI}$=0.5, and 11.2% solids; (3) 30 wt % PE5833B and 70 wt % B14S, $Wt_{PB}$=1.0, $Wt_{THDI}$=1.0, with 11.4% solids; (4) 30 wt % PE5833B and 70 wt % B14S, $Wt_{PB}$=1.0, $Wt_{THDI}$=2.0, with 11.9% solids. These mixes and their components are shown in Table 2. The carrier ID in the table corresponds to the mix number (1-4) in this paragraph. The solvent in these preparations was methyl ethyl ketone (MEK).

These mixes and their components are shown in Table 2. A non-photosensitive carrier layer formulated from these mixes was applied to the substrate, for each of the 31 samples shown in Table 2, using techniques outlined in the Methods section. To each of these carrier samples, a silver emulsion layer and topcoat layer were simultaneously applied as described in the Methods section at a time delay relative to the placement of the topcoat as indicated in the table. The silver coating mixtures used to construct the silver layers were prepared as described in the procedure (1) and procedure (2) sections of the Methods sections. Each applied silver coating layer contained a mixture of a standard silver formulation with a variable amount of PVP/PA or cross-linker as indicated in Table 1. These silver emulsion mixtures follow the same formulism and numbering format as those in Example 1.

Experiments illustrated in this example explored different concentrations of THDI in the non-photosensitive carrier layer (0.25-1 wt %) when all carrier mixtures contained PVP-VA and all silver emulsion layers were applied 24 hours or 36 hours after the application of the non-photosensitive carrier layer. It was determined that the addition of THDI improves adhesion between layers, which replicated and confirmed the results outlined in Example 1 (compare sample 2-1 to sample 2-9, for example). Further, it was determined that THDI component of 0.5 to 1 weight percent in the carrier mixture had the best processed $D_{max}$ adhesion of the samples tested (samples 2-9, 2-10, 2-13, 2-14, 2-17, and 2-18, for example). This example demonstrates there are several cases in which adhesion between layers is not improved by changing experimental factors, such as the drying time, without adding THDI to the non-photosensitive carrier layer if PVP-VA is present in the thermographic layer (see samples 2-28 to 2-30, for example).

Example 3

Several samples of photothermographic material were made according to the preparations discussed in the methods section. The samples in Table 3, labeled 3-1 through 3-3, were prepared using a resin mixture in the non-photosensitive carrier layer comprising 30% PE5833B and 70% B14S by weight, and a variable amount of THDI in the non-photosensitive carrier layer mixture. The non-photosensitive carrier layer mixture is described and identified by the same numerical system as in Example 2. The composition of the silver layer was either the control layer described in Example 1 as Mixture 1, or Mixture 2. The solvent in these preparations was methyl ethyl ketone (MEK).

A non-photosensitive carrier layer was applied to the substrate, using techniques outlined in the Methods section, for each of the three samples shown in Table 3. To each of these carrier samples, a silver coating was applied as outlined in Methods.

These experiments demonstrate that the optimized THDI concentration is 1 wt % because this concentration maintained the crosshatch adhesion improvements with a 30 day pot life of the solution.

The invention has been described in detail with reference to specific embodiments, but it will be understood that variations and modifications can be effected within the spirit and scope of the invention. The presently disclosed embodiments are therefore considered in all respects to be illustrative and not restrictive. The scope of the invention is indicated by the attached claims, and all changes that come within the meaning and range of equivalents thereof are intended to be embraced therein.

TABLE 2

| Sample | Mixture | Carrier ID | $Wt_{PB}$ | $Wt_{THDI}$ | Carrier Age (hours) | Processed $D_{max}$ Ag to Ag Carrier | Processed $D_{max}$ TC to Ag |
|---|---|---|---|---|---|---|---|
| 2-1 | 1 | 1 | 1 | 0 | 24 | 3 | 3 |
| 2-2 | 1 | 3 | 1 | 1 | 24 | 5 | 4.5 |
| 2-3 | 4 | 1 | 1 | 0 | 24 | 0 | N/A |
| 2-4 | 4 | 2 | 1 | 0.5 | 24 | 0 | N/A |
| 2-5 | 4 | 3 | 1 | 1 | 24 | 5 | 3 |
| 2-6 | 4 | 4 | 1 | 2 | 24 | 5 | 4 |
| 2-7 | 2 | 1 | 1 | 0 | 24 | 0 | N/A |
| 2-8 | 2 | 2 | 1 | 0.5 | 24 | 0 | N/A |
| 2-9 | 2 | 3 | 1 | 1 | 24 | 5 | 3 |
| 2-10 | 2 | 4 | 1 | 2 | 24 | 5 | 4 |
| 2-11 | 9 | 1 | 1 | 0 | 24 | 0 | N/A |
| 2-12 | 9 | 2 | 1 | 0.5 | 24 | 1 | 2 |
| 2-13 | 9 | 3 | 1 | 1 | 24 | 5 | 3 |
| 2-14 | 9 | 4 | 1 | 2 | 24 | 5 | 3 |
| 2-15 | 5 | 1 | 1 | 0 | 24 | 4 | 3 |
| 2-16 | 5 | 2 | 1 | 0.5 | 24 | 4 | 3 |
| 2-17 | 5 | 3 | 1 | 1 | 24 | 5 | 4 |
| 2-18 | 5 | 4 | 1 | 2 | 24 | 5 | 4 |
| 2-19 | 10 | 1 | 1 | 0 | 24 | 4 | 3 |
| 2-20 | 10 | 2 | 1 | 0.5 | 24 | 5 | 3 |
| 2-21 | 10 | 3 | 1 | 1 | 24 | 5 | 3 |
| 2-22 | 10 | 4 | 1 | 2 | 24 | 5 | 3 |
| 2-23 | 7 | 1 | 1 | 0 | 24 | 3 | 1 |
| 2-24 | 12 | 1 | 1 | 0 | 24 | 0 | N/A |
| 2-25 | 13 | 1 | 1 | 0 | 24 | 0 | N/A |
| 2-26 | 1 | 1 | 1 | 0 | 72 | 5 | 4 |
| 2-27 | 2 | 3 | 1 | 1 | 72 | 5 | 4 |
| 2-28 | 1 | 1 | 1 | 0 | 72 | 4 | 3 |
| 2-29 | 2 | 1 | 1 | 0 | 72 | 0 | N/A |
| 2-30 | 2 | 3 | 1 | 1 | 72 | 5 | 4 |
| 2-31 | 2 (coated hot) | 3 | 1 | 1 | 72 | 5 | 5 |

TABLE 3

| Sample # | Mixture | Carrier ID | Carrier Pot Life | Silver Pot Life | Processed Dmax Ag to Ag Carrier | Processed Dmax Ag to Ag Carrier |
|---|---|---|---|---|---|---|
| 3-1 | 1 | 1 | 36 days | 24 hrs | 1 | 1 |
| 3-2 | 2 | 3 | 36 days | 24 hrs | 4 | 2 |
| 3-3 | 2 | 4 | 30 days | 24 hrs | 5 | 5 |

What is claimed:

1. A thermally developable material comprising a support and having thereon:
    at least one non-photosensitive carrier layer comprising at least one first binder comprising at least one first binder compound comprising first vinyl butyral repeat units and first vinyl alcohol repeat units, at least one adhesion promoting compound, and at least one first crosslinker compound comprising first isocyanate groups; and
    at least one thermally developable imaging layer comprising organic silver salt grains, light-sensitive silver halide grains, at least one reducing agent, at least one second binder comprising at least one second binder compound comprising second vinyl butyral repeat units and second vinyl alcohol repeat units, and at least one second crosslinker compound comprising second isocyanate groups,
    wherein the equivalent ratio of the first vinyl alcohol repeat units to the second isocyanate groups is no greater than about 56.

2. The thermally developable material according to claim 1, wherein the at least one first crosslinker compound is selected from the group consisting of 1,6-hexamethylene diisocyanate, trimer hexamethylene diisocyanate, and poly (1,6-hexamethylene diisocyanate).

3. The thermally developable material according to claim 2, wherein the at least one second crosslinker compound is selected from the group consisting of 1,6-hexamethylene diisocyanate, trimer hexamethylene diisocyanate, and poly (1,6-hexamethylene diisocyanate).

4. The thermally developable material according to claim 1, wherein the equivalent ratio of the first vinyl alcohol repeat units to the second isocyanate groups is between about 14 and about 28.

5. The thermally developable material according to claim 1, wherein the equivalent ratio of the first vinyl alcohol repeat units to the second isocyanate groups is about 14.

6. The thermally developable material according to claim 1, wherein the at least one thermally developable layer further comprises poly(vinyl pyrrolidone/vinyl acetate).

7. The thermally developable material according to claim 1, wherein the at least one adhesion promoting compound comprises ester groups.

8. The thermally developable material according to claim 1, wherein the at least one first binder compound comprises poly[(vinyl butyral)-ran-(vinyl alcohol)-ran-(vinyl acetate)].

9. The thermally developable material according to claim 8, wherein the weight ratio of the first vinyl alcohol repeat units to the first vinyl butyral repeat units is about 1:5.

10. A method for preparation of the thermally developable material of claim 1, comprising:
    disposing the at least one non-photosensitive carrier layer on the substrate; and
    disposing the at least one thermally developable imaging layer on the at least one non-photo-sensitive carrier layer.

* * * * *